(12) United States Patent
Rueckes et al.

(10) Patent No.: US 7,745,810 B2
(45) Date of Patent: Jun. 29, 2010

(54) NANOTUBE FILMS AND ARTICLES

(75) Inventors: Thomas Rueckes, Boston, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 10/774,682

(22) Filed: Feb. 9, 2004

(65) Prior Publication Data

US 2004/0159833 A1    Aug. 19, 2004

Related U.S. Application Data

(60) Division of application No. 10/128,118, filed on Apr. 23, 2002, now Pat. No. 6,706,402, which is a continuation-in-part of application No. 09/915,173, filed on Jul. 25, 2001, now Pat. No. 6,643,165, which is a continuation-in-part of application No. 09/915,095, filed on Jul. 25, 2001, now Pat. No. 6,574,130, which is a continuation-in-part of application No. 09/915,093, filed on Jul. 25, 2001, now Pat. No. 6,919,592.

(51) Int. Cl.
   *H01L 47/00*    (2006.01)
(52) U.S. Cl. .................. 257/4; 257/414; 257/E39.008; 977/742
(58) Field of Classification Search ................ 257/661, 257/662, 664, 739, 4, 414; 977/742
   See application file for complete search history.

(56) References Cited

U.S. PATENT DOCUMENTS 3,448,302 A    6/1969    Shanefield (Continued)

FOREIGN PATENT DOCUMENTS

DE    4446289    6/1996

(Continued)

OTHER PUBLICATIONS

K. Kaneto et al., "Electrical conductivities of multi-wall carbon nano tubes", Synthetic Materials, Elsevier Science S. A., vol. 103, 1999, pp. 2543-2546.*

(Continued)

*Primary Examiner*—W. David Coleman
(74) *Attorney, Agent, or Firm*—Wilmer Cutler Pickering Hale and Dorr LLP

(57) ABSTRACT

Nanotube films and articles and methods of making the same are disclosed. A conductive article includes an aggregate of nanotube segments in which the nanotube segments contact other nanotube segments to define a plurality of conductive pathways along the article. The nanotube segments may be single walled carbon nanotubes, or multi-walled carbon nanotubes. The various segments may have different lengths and may include segments having a length shorter than the length of the article. The articles so formed may be disposed on substrates, and may form an electrical network of nanotubes within the article itself. Conductive articles may be made on a substrate by forming a nanotube fabric on the substrate, and defining a pattern within the fabric in which the pattern corresponds to the conductive article. The nanotube fabric may be formed by growing the nanotube fabric on the substrate using a catalyst, for example, in which the catalyst is a gas phase catalyst, or in which the catalyst is a metallic gas phase catalyst. The nanotube fabric may be formed by depositing a solution of suspended nanotubes on the substrate. The deposited solution may be spun to create a spin-coating of the solution. The solution may be deposited by dipping the substrate into the solution. The nanotube fabric is formed by spraying an aerosol having nanotubes onto a surface of the substrate.

18 Claims, 20 Drawing Sheets

U.S. PATENT DOCUMENTS

| | | |
|---|---|---|
| 3,740,494 A | 6/1973 | Dunand et al. |
| 3,892,890 A | 7/1975 | Watanabe et al. |
| 3,970,887 A | 7/1976 | Smith et al. |
| 4,324,814 A | 4/1982 | Reichert |
| 4,378,629 A | 4/1983 | Bozlev et al. |
| 4,495,511 A | 1/1985 | Yoder |
| 4,510,016 A | 4/1985 | Chi et al. |
| 4,524,431 A | 6/1985 | Haken et al. |
| 4,673,474 A | 6/1987 | Ogawa |
| 4,694,427 A | 9/1987 | Miyamoto et al. |
| 4,701,842 A | 10/1987 | Olnowich |
| 4,707,197 A | 11/1987 | Hensel et al. |
| 4,758,534 A | 7/1988 | Derkits, Jr. et al. |
| 4,819,212 A | 4/1989 | Nakai et al. |
| 4,845,533 A | 7/1989 | Pryor et al. |
| 4,853,893 A | 8/1989 | Eaton, Jr. et al. |
| 4,876,667 A | 10/1989 | Ross et al. |
| 4,888,630 A | 12/1989 | Paterson |
| 4,901,121 A | 2/1990 | Gibson et al. |
| 4,903,090 A | 2/1990 | Yokoyama |
| 4,939,556 A | 7/1990 | Eguchi et al. |
| 4,947,226 A | 8/1990 | Huang et al. |
| 4,979,149 A | 12/1990 | Popovic et al. |
| 4,985,871 A | 1/1991 | Catlin |
| 5,010,037 A | 4/1991 | Lin et al. |
| 5,031,145 A | 7/1991 | Lever |
| 5,032,538 A | 7/1991 | Bozler et al. |
| 5,051,956 A | 9/1991 | Burns |
| 5,057,883 A | 10/1991 | Noda |
| 5,089,545 A | 2/1992 | Pol |
| 5,155,561 A | 10/1992 | Bozler et al. |
| 5,161,218 A | 11/1992 | Catlin |
| 5,168,070 A | 12/1992 | Luth |
| 5,175,597 A | 12/1992 | Cachier et al. |
| 5,184,320 A | 2/1993 | Dye |
| 5,196,396 A | 3/1993 | Lieber |
| 5,198,390 A | 3/1993 | MacDonald et al. |
| 5,198,994 A | 3/1993 | Natori |
| 5,216,631 A | 6/1993 | Sliwa et al. |
| 5,252,835 A | 10/1993 | Lieber et al. |
| 5,271,862 A | 12/1993 | Freese |
| 5,290,715 A | 3/1994 | Pandya |
| 5,316,979 A | 5/1994 | MacDonald et al. |
| 5,346,683 A | 9/1994 | Green et al. |
| 5,412,785 A | 5/1995 | Skruhak et al. |
| 5,424,054 A | 6/1995 | Bethune et al. |
| 5,426,070 A | 6/1995 | Shaw et al. |
| 5,444,421 A | 8/1995 | Carroll et al. |
| 5,444,651 A | 8/1995 | Yamamoto et al. |
| 5,453,970 A | 9/1995 | Rust et al. |
| 5,456,986 A | 10/1995 | Majetich et al. |
| 5,475,341 A | 12/1995 | Reed |
| 5,479,172 A | 12/1995 | Smith et al. |
| 5,482,601 A | 1/1996 | Ohshima et al. |
| 5,517,194 A | 5/1996 | Carroll et al. |
| 5,521,602 A | 5/1996 | Carroll et al. |
| 5,533,061 A | 7/1996 | Smith et al. |
| 5,538,916 A | 7/1996 | Kuroi et al. |
| 5,547,748 A | 8/1996 | Ruoff et al. |
| 5,553,099 A | 9/1996 | Carroll et al. |
| 5,563,424 A | 10/1996 | Yang et al. |
| 5,586,286 A | 12/1996 | Santeler et al. |
| 5,589,692 A | 12/1996 | Reed |
| 5,590,078 A | 12/1996 | Chatter |
| 5,591,312 A | 1/1997 | Smalley |
| 5,592,642 A | 1/1997 | Thomas |
| 5,592,643 A | 1/1997 | Thomas |
| 5,592,644 A | 1/1997 | Thomas |
| 5,608,246 A | 3/1997 | Yeager et al. |
| 5,608,888 A | 3/1997 | Purcell et al. |
| 5,623,638 A | 4/1997 | Andrade |
| 5,626,670 A | 5/1997 | Varshney et al. |
| 5,626,812 A | 5/1997 | Ebbesen et al. |
| 5,640,133 A | 6/1997 | MacDonald et al. |
| 5,640,343 A | 6/1997 | Gallagher et al. |
| 5,650,958 A | 7/1997 | Gallagher et al. |
| 5,651,126 A | 7/1997 | Bailey et al. |
| 5,652,856 A | 7/1997 | Santeler et al. |
| 5,676,865 A | 10/1997 | Chang |
| 5,699,317 A | 12/1997 | Sartore et al. |
| 5,716,708 A | 2/1998 | Lagow |
| 5,719,073 A | 2/1998 | Shaw et al. |
| 5,721,862 A | 2/1998 | Sartore et al. |
| 5,739,057 A | 4/1998 | Tiwari et al. |
| 5,747,180 A | 5/1998 | Miller et al. |
| 5,751,156 A | 5/1998 | Muller et al. |
| 5,753,088 A | 5/1998 | Olk |
| 5,780,101 A | 7/1998 | Nolan et al. |
| 5,781,717 A | 7/1998 | Wu et al. |
| 5,793,697 A | 8/1998 | Scheuerlein |
| 5,799,209 A | 8/1998 | Chatter |
| 5,802,583 A | 9/1998 | Yeager et al. |
| 5,829,125 A | 11/1998 | Fujimoto et al. |
| 5,838,165 A | 11/1998 | Chatter |
| 5,840,435 A | 11/1998 | Lieber et al. |
| 5,841,692 A | 11/1998 | Gallagher et al. |
| 5,846,849 A | 12/1998 | Shaw et al. |
| 5,847,454 A | 12/1998 | Shaw et al. |
| 5,847,565 A | 12/1998 | Narayanan |
| 5,850,089 A | 12/1998 | Varshney et al. |
| 5,850,231 A | 12/1998 | Orimoto et al. |
| 5,858,862 A | 1/1999 | Westwater et al. |
| 5,875,451 A | 2/1999 | Joseph |
| 5,878,840 A | 3/1999 | Tessum et al. |
| 5,887,272 A | 3/1999 | Sartore et al. |
| 5,897,945 A | 4/1999 | Lieber et al. |
| 5,903,010 A | 5/1999 | Flory et al. |
| 5,909,624 A | 6/1999 | Yeager et al. |
| 5,914,553 A | 6/1999 | Adams et al. |
| 5,925,465 A | 7/1999 | Ebbesen et al. |
| 5,928,450 A | 7/1999 | Russell |
| 5,930,164 A | 7/1999 | Zhu |
| 5,939,785 A | 8/1999 | Klonis et al. |
| 5,946,228 A | 8/1999 | Abraham et al. |
| 5,946,930 A | 9/1999 | Anthony |
| 5,973,444 A | 10/1999 | Xu et al. |
| 5,985,446 A | 11/1999 | Lagow |
| 5,993,697 A | 11/1999 | Cohen et al. |
| 5,994,733 A | 11/1999 | Nishioka et al. |
| 5,997,832 A | 12/1999 | Lieber et al. |
| 6,025,618 A | 2/2000 | Chen |
| 6,031,711 A | 2/2000 | Tennent et al. |
| 6,031,756 A | 2/2000 | Gimzewski et al. |
| 6,036,774 A | 3/2000 | Lieber et al. |
| 6,038,060 A | 3/2000 | Crowley |
| 6,038,637 A | 3/2000 | Berube et al. |
| 6,044,008 A | 3/2000 | Choi |
| 6,048,740 A | 4/2000 | Hsu et al. |
| 6,049,856 A | 4/2000 | Bolyn |
| 6,051,866 A | 4/2000 | Shaw et al. |
| 6,052,263 A | 4/2000 | Gill |
| 6,052,313 A | 4/2000 | Atsumi et al. |
| 6,057,637 A | 5/2000 | Zettl et al. |
| 6,060,724 A | 5/2000 | Flory et al. |
| 6,062,931 A | 5/2000 | Chuang et al. |
| 6,063,243 A | 5/2000 | Zettl et al. |
| 6,064,107 A | 5/2000 | Yeh et al. |
| 6,069,380 A | 5/2000 | Chou et al. |
| 6,072,718 A | 6/2000 | Abraham et al. |
| 6,083,624 A | 7/2000 | Hiura |
| 6,087,293 A | 7/2000 | Carnahan et al. |
| 6,088,760 A | 7/2000 | Walker et al. |
| 6,100,109 A | 8/2000 | Melzner et al. |
| 6,104,633 A | 8/2000 | Abraham et al. |

| | | | | | | |
|---|---|---|---|---|---|---|
| 6,105,381 | A | 8/2000 | Ghoshal | 6,495,258 B1 | 12/2002 | Chen et al. |
| 6,108,725 | A | 8/2000 | Chatter | 6,515,339 B2 | 2/2003 | Shin et al. |
| 6,128,214 | A | 10/2000 | Kuekes et al. | 6,518,156 B1 | 2/2003 | Chen et al. |
| 6,136,160 | A | 10/2000 | Hrkut et al. | 6,528,020 B1 | 3/2003 | Dai et al. |
| 6,138,219 | A | 10/2000 | Soman et al. | 6,533,620 B2 | 3/2003 | Franzen et al. |
| 6,144,481 | A | 11/2000 | Kowarz et al. | 6,541,309 B2 | 4/2003 | Chen |
| 6,146,227 | A | 11/2000 | Mancevski | 6,548,841 B2 | 4/2003 | Frazier et al. |
| 6,156,256 | A | 12/2000 | Kennel | 6,559,468 B1 | 5/2003 | Kuekes et al. |
| 6,159,620 | A | 12/2000 | Heath et al. | 6,566,983 B1 | 5/2003 | Shin |
| 6,159,742 | A | 12/2000 | Lieber et al. | 6,574,130 B2 | 6/2003 | Segal et al. |
| 6,165,890 | A | 12/2000 | Kohl et al. | 6,586,965 B2 | 7/2003 | Kuekes |
| 6,166,948 | A | 12/2000 | Parkin et al. | 6,595,405 B2 | 7/2003 | Terunuma et al. |
| 6,177,703 | B1 | 1/2001 | Cunningham | 6,611,033 B2 | 8/2003 | Hsu et al. |
| 6,183,714 | B1 | 2/2001 | Smalley et al. | 6,625,047 B2 | 9/2003 | Coleman, Jr. |
| 6,187,823 | B1 | 2/2001 | Haddon et al. | 6,630,772 B1 | 10/2003 | Bower et al. |
| 6,190,634 | B1 | 2/2001 | Lieber et al. | 6,642,639 B2 | 11/2003 | Choi et al. |
| 6,198,655 | B1 | 3/2001 | Heath et al. | 6,643,165 B2 | 11/2003 | Segal et al. |
| 6,203,814 | B1 | 3/2001 | Fisher et al. | 6,645,628 B2 | 11/2003 | Shiffler, Jr. et al. |
| 6,203,864 | B1 | 3/2001 | Zhang et al. | 6,658,634 B1 | 12/2003 | Goodnow et al. |
| 6,212,597 | B1 | 4/2001 | Conlin et al. | 6,673,424 B1 | 1/2004 | Lindsay et al. |
| 6,219,212 | B1 | 4/2001 | Gill et al. | 6,705,152 B2 | 3/2004 | Routkevitch et al. |
| 6,221,330 | B1 | 4/2001 | Moy et al. | 6,706,402 B2 | 3/2004 | Rueckes et al. |
| 6,226,722 | B1 | 5/2001 | Shippy et al. | 6,707,098 B2 | 3/2004 | Hofmann et al. |
| 6,231,744 | B1 | 5/2001 | Ying et al. | 6,709,566 B2 | 3/2004 | Cumings et al. |
| 6,231,980 | B1 | 5/2001 | Cohen et al. | 6,743,408 B2 * | 6/2004 | Lieber et al. ............. 423/447.1 |
| 6,232,706 | B1 | 5/2001 | Dai et al. | 6,750,471 B2 | 6/2004 | Bethune et al. |
| 6,233,665 | B1 | 5/2001 | Bolyn | 6,756,026 B2 | 6/2004 | Colbert et al. |
| 6,237,130 | B1 | 5/2001 | Soman et al. | 6,759,693 B2 | 7/2004 | Vogeli et al. |
| 6,239,547 | B1 | 5/2001 | Uemura et al. | 6,774,052 B2 | 8/2004 | Vogeli et al. |
| 6,250,984 | B1 | 6/2001 | Jin et al. | 6,781,166 B2 | 8/2004 | Lieber et al. |
| 6,256,767 | B1 | 7/2001 | Kuekes et al. | 6,784,028 B2 | 8/2004 | Rueckes et al. |
| 6,259,277 | B1 | 7/2001 | Tour et al. | 6,803,840 B2 | 10/2004 | Hunt et al. |
| 6,262,469 | B1 | 7/2001 | Le et al. | 6,808,746 B1 | 10/2004 | Dai et al. |
| 6,265,333 | B1 | 7/2001 | Dzenis et al. | 6,809,462 B2 | 10/2004 | Pelrine et al. |
| 6,277,318 | B1 * | 8/2001 | Bower et al. ................ 264/346 | 6,809,465 B2 | 10/2004 | Jin |
| 6,300,205 | B1 | 10/2001 | Fulford et al. | 6,833,558 B2 | 12/2004 | Lee et al. |
| 6,314,019 | B1 | 11/2001 | Kuekes et al. | 6,835,591 B2 | 12/2004 | Rueckes et al. |
| 6,320,428 | B1 | 11/2001 | Atsumi et al. | 6,858,197 B1 | 2/2005 | Delzeit |
| 6,322,713 | B1 | 11/2001 | Choi et al. | 6,863,942 B2 | 3/2005 | Ren et al. |
| 6,325,909 | B1 | 12/2001 | Li et al. | 6,896,864 B2 | 5/2005 | Clarke |
| 6,331,209 | B1 | 12/2001 | Jang et al. | 6,899,945 B2 | 5/2005 | Smalley et al. |
| 6,333,016 | B1 | 12/2001 | Resasco et al. | 6,911,682 B2 | 6/2005 | Rueckes et al. |
| 6,340,822 | B1 | 1/2002 | Brown et al. | 6,918,284 B2 | 7/2005 | Snow et al. |
| 6,342,276 | B1 | 1/2002 | You et al. | 6,919,529 B2 | 7/2005 | Franzen et al. |
| 6,346,413 | B1 | 2/2002 | Fodor et al. | 6,919,592 B2 | 7/2005 | Segal et al. |
| 6,348,295 | B1 | 2/2002 | Griffith et al. | 6,919,730 B2 * | 7/2005 | Cole et al. ................... 324/715 |
| 6,348,700 | B1 | 2/2002 | Ellenbogen et al. | 6,919,740 B2 | 7/2005 | Snider |
| 6,350,488 | B1 | 2/2002 | Lee et al. | 6,921,575 B2 | 7/2005 | Horiuchi et al. |
| 6,354,133 | B1 | 3/2002 | Yedur et al. | 6,924,538 B2 | 8/2005 | Jaiprakash et al. |
| 6,358,756 | B1 | 3/2002 | Sandhu et al. | 6,946,410 B2 | 9/2005 | French et al. |
| 6,361,861 | B2 | 3/2002 | Gao et al. | 6,955,937 B1 | 10/2005 | Burke et al. |
| 6,362,073 | B2 | 3/2002 | Kim | 6,969,651 B1 | 11/2005 | Lu et al. |
| 6,376,787 | B1 | 4/2002 | Martin et al. | 7,015,500 B2 | 3/2006 | Choi et al. |
| 6,380,434 | B1 | 4/2002 | Chiang | 7,048,999 B2 | 5/2006 | Smalley et al. |
| 6,394,158 | B1 | 5/2002 | Momeni et al. | 7,057,402 B2 | 6/2006 | Cole et al. |
| 6,400,088 | B1 * | 6/2002 | Livingston et al. ............ 315/94 | 2001/0004979 A1 | 6/2001 | Han et al. |
| 6,400,091 | B1 | 6/2002 | Deguchi et al. | 2001/0023123 A1 | 9/2001 | Kim |
| 6,406,776 | B1 | 6/2002 | D'Evelyn | 2001/0023986 A1 | 9/2001 | Mancevski |
| 6,407,443 | B2 | 6/2002 | Chen et al. | 2002/0055010 A1 | 5/2002 | Gao et al. |
| 6,409,567 | B1 | 6/2002 | Amey et al. | 2002/0061441 A1 | 5/2002 | Ogura et al. |
| 6,413,487 | B1 | 7/2002 | Resasco et al. | 2002/0068170 A1 | 6/2002 | Smalley et al. |
| 6,417,606 | B1 | 7/2002 | Nakamoto et al. | 2002/0081380 A1 | 6/2002 | Dillon et al. |
| 6,420,726 | B2 | 7/2002 | Choi et al. | 2002/0081787 A1 | 6/2002 | Kohl et al. |
| 6,421,271 | B1 | 7/2002 | Gogl et al. | 2002/0088938 A1 | 7/2002 | Colbert et al. |
| 6,422,450 | B1 | 7/2002 | Zhou et al. | 2002/0090331 A1 | 7/2002 | Smalley et al. |
| 6,423,583 | B1 | 7/2002 | Avouris et al. | 2002/0092983 A1 | 7/2002 | Colbert et al. |
| 6,426,134 | B1 | 7/2002 | Lavin et al. | 2002/0092984 A1 | 7/2002 | Colbert et al. |
| 6,426,687 | B1 | 7/2002 | Osborn | 2002/0096634 A1 | 7/2002 | Colbert et al. |
| 6,432,740 | B1 | 8/2002 | Chen | 2002/0098135 A1 | 7/2002 | Smalley et al. |
| 6,440,761 | B1 | 8/2002 | Choi et al. | 2002/0102193 A1 | 8/2002 | Smalley et al. |
| 6,443,901 | B1 | 9/2002 | Fraser | 2002/0102194 A1 | 8/2002 | Smalley et al. |
| 6,445,006 | B1 * | 9/2002 | Brandes et al. ................ 257/76 | 2002/0102196 A1 | 8/2002 | Smalley et al. |
| 6,495,116 | B1 | 12/2002 | Herman | 2002/0102353 A1 | 8/2002 | Mauthner et al. |

| | | | | | | |
|---|---|---|---|---|---|---|
| 2002/0112814 | A1 | 8/2002 | Hafner et al. | 2005/0058797 A1 | 3/2005 | Sen et al. |
| 2002/0125805 | A1 | 9/2002 | Hsu | 2005/0058834 A1 | 3/2005 | Rueckes et al. |
| 2002/0130311 | A1 | 9/2002 | Lieber et al. | 2005/0059176 A1 | 3/2005 | Rueckes et al. |
| 2002/0130353 | A1 | 9/2002 | Lieber et al. | 2005/0059210 A1 | 3/2005 | Rueckes et al. |
| 2002/0136896 | A1 | 9/2002 | Takikawa et al. | 2005/0062035 A1 | 3/2005 | Bertin et al. |
| 2002/0160111 | A1 | 10/2002 | Sun et al. | 2005/0062062 A1 | 3/2005 | Bertin et al. |
| 2002/0172639 | A1 | 11/2002 | Horiuchi | 2005/0062070 A1 | 3/2005 | Bertin et al. |
| 2002/0172963 | A1 | 11/2002 | Kelley et al. | 2005/0063210 A1 | 3/2005 | Segal et al. |
| 2002/0173083 | A1 | 11/2002 | Avouris et al. | 2005/0063244 A1 | 3/2005 | Bertin et al. |
| 2002/0175323 | A1 | 11/2002 | Guillom et al. | 2005/0065741 A1 | 3/2005 | Segal et al. |
| 2002/0175390 | A1 | 11/2002 | Goldstein et al. | 2005/0068128 A1 | 3/2005 | Yip |
| 2002/0179434 | A1 | 12/2002 | Dai et al. | 2005/0074926 A1 | 4/2005 | Bertin et al. |
| 2003/0004058 | A1 | 1/2003 | Li et al. | 2005/0095938 A1 | 5/2005 | Rosenberger et al. |
| 2003/0021141 | A1 | 1/2003 | Segal et al. | 2005/0101112 A1 | 5/2005 | Rueckes et al. |
| 2003/0021966 | A1 | 1/2003 | Segal et al. | 2005/0128788 A1 | 6/2005 | Segal et al. |
| 2003/0022428 | A1 | 1/2003 | Segal et al. | 2005/0174842 A1 | 8/2005 | Bertin et al. |
| 2003/0042834 | A1 | 3/2003 | Dean et al. | 2005/0191495 A1 | 9/2005 | Rueckes et al. |
| 2003/0091825 | A1 | 5/2003 | Shiffler et al. | 2005/0237781 A1 | 10/2005 | Bertin et al. |
| 2003/0108480 | A1 | 6/2003 | Baker et al. | 2005/0269553 A1 | 12/2005 | Sen et al. |
| 2003/0118727 | A1 | 6/2003 | Ting et al. | 2005/0269554 A1 | 12/2005 | Sen et al. |
| 2003/0122111 | A1 | 7/2003 | Glatkowski | 2005/0270824 A1 | 12/2005 | Bertin et al. |
| 2003/0124325 | A1 | 7/2003 | Rueckes et al. | 2005/0279988 A1 | 12/2005 | Bertin |
| 2003/0124837 | A1 | 7/2003 | Rueckes et al. | 2005/0280436 A1 | 12/2005 | Bertin |
| 2003/0132823 | A1 | 7/2003 | Hyman et al. | 2005/0281084 A1 | 12/2005 | Rueckes et al. |
| 2003/0165074 | A1 | 9/2003 | Segal et al. | 2005/0282515 A1 | 12/2005 | Bertin |
| 2003/0177450 | A1 | 9/2003 | Nugent | 2005/0282516 A1 | 12/2005 | Bertin |
| 2003/0180472 | A1 | 9/2003 | Zhou et al. | 2006/0044035 A1 | 3/2006 | Bertin |
| 2003/0198812 | A1 | 10/2003 | Rueckes et al. | 2006/0052509 A1 | 3/2006 | Saitoh |
| 2003/0199172 | A1 | 10/2003 | Rueckes et al. | 2006/0061389 A1 | 3/2006 | Bertin |
| 2003/0200521 | A1 | 10/2003 | DeHon et al. | 2006/0125033 A1 | 6/2006 | Segal et al. |
| 2003/0206436 | A1 | 11/2003 | Eaton et al. | 2006/0128049 A1 | 6/2006 | Jaiprakash et al. |
| 2003/0234407 | A1 | 12/2003 | Vogeli et al. | 2006/0183278 A1 | 8/2006 | Bertin et al. |
| 2003/0236000 | A1 | 12/2003 | Vogeli et al. | 2006/0193093 A1 | 8/2006 | Bertin et al. |
| 2004/0005723 | A1 | 1/2004 | Empedocles et al. | 2006/0204427 A1 | 9/2006 | Ghenciu et al. |
| 2004/0007528 | A1 | 1/2004 | Bakajin et al. | 2006/0231865 A1 | 10/2006 | Rueckes et al. |
| 2004/0023253 | A1 | 2/2004 | Kunwar et al. | 2006/0237537 A1 | 10/2006 | Empedocles et al. |
| 2004/0023514 | A1 | 2/2004 | Moriya et al. | 2006/0237799 A1 | 10/2006 | Lu et al. |
| 2004/0041154 | A1 | 3/2004 | Watanabe et al. | 2006/0237805 A1 | 10/2006 | Segal et al. |
| 2004/0043527 | A1 | 3/2004 | Bradley et al. | 2006/0237857 A1 | 10/2006 | Bertin et al. |
| 2004/0071949 | A1 | 4/2004 | Glatkowski et al. | 2006/0250843 A1 | 11/2006 | Bertin et al. |
| 2004/0075159 | A1 | 4/2004 | Vogeli | 2006/0250856 A1 | 11/2006 | Bertin et al. |
| 2004/0077107 | A1 | 4/2004 | Vogeli | 2006/0255834 A1 | 11/2006 | Bertin |
| 2004/0085805 | A1 | 5/2004 | Segal et al. | 2006/0276056 A1 | 12/2006 | Ward et al. |
| 2004/0087162 | A1 | 5/2004 | Vogeli | 2006/0278902 A1 | 12/2006 | Sun et al. |
| 2004/0099438 | A1 | 5/2004 | Arthur et al. | 2007/0015303 A1 | 1/2007 | Bertin et al. |
| 2004/0104129 | A1 | 6/2004 | Gu et al. | | | |
| 2004/0159833 | A1 | 8/2004 | Rueckes et al. | FOREIGN PATENT DOCUMENTS | | |
| 2004/0164289 | A1 | 8/2004 | Rueckes et al. | | | |
| 2004/0175856 | A1 | 9/2004 | Jaiprakash et al. | DE | 19504967 | 8/1996 |
| 2004/0181630 | A1 | 9/2004 | Jaiprakash et al. | DE | 19644121 | 5/1997 |
| 2004/0191978 | A1 | 9/2004 | Rueckes et al. | DE | 19929179 | 1/2001 |
| 2004/0214366 | A1 | 10/2004 | Segal et al. | EP | 0 217 023 A2 | 4/1987 |
| 2004/0214367 | A1 | 10/2004 | Segal et al. | EP | 0 296 716 A3 | 5/1988 |
| 2004/0238907 | A1 | 12/2004 | Pinkerton et al. | EP | 0 269 225 A2 | 6/1988 |
| 2004/0253167 | A1 | 12/2004 | Silva et al. | EP | 0 269 225 A3 | 6/1988 |
| 2004/0265550 | A1 | 12/2004 | Glatkowski et al. | EP | 441 409 A3 | 7/1988 |
| 2005/0007002 | A1 | 1/2005 | Golovchenko et al. | EP | 441 409 B1 | 7/1988 |
| 2005/0035344 | A1 | 2/2005 | Bertin et al. | EP | 0 296 716 A3 | 12/1988 |
| 2005/0035367 | A1 | 2/2005 | Bertin et al. | EP | 0 315 392 A2 | 5/1989 |
| 2005/0035786 | A1 | 2/2005 | Bertin et al. | EP | 0 315 392 A3 | 5/1989 |
| 2005/0035787 | A1 | 2/2005 | Bertin et al. | EP | 0296716 A3 | 7/1990 |
| 2005/0036365 | A1 | 2/2005 | Bertin et al. | EP | 426 282 B1 | 8/1990 |
| 2005/0037547 | A1 | 2/2005 | Bertin et al. | EP | 0 426 282 | 5/1991 |
| 2005/0040874 | A1 | 2/2005 | Allison et al. | EP | 0 613 130 A1 | 8/1994 |
| 2005/0041465 | A1 | 2/2005 | Rueckes et al. | EP | 0 665 187 B1 | 1/1995 |
| 2005/0041466 | A1 | 2/2005 | Rueckes et al. | EP | 0 665 187 A1 | 8/1995 |
| 2005/0047244 | A1 | 3/2005 | Rueckes et al. | EP | 0 688 618 A2 | 8/1995 |
| 2005/0052894 | A1 | 3/2005 | Segal et al. | EP | 758 028 A3 | 7/1996 |
| 2005/0053525 | A1 | 3/2005 | Segal et al. | EP | 1 209 123 A2 | 9/1996 |
| 2005/0056825 | A1 | 3/2005 | Bertin et al. | EP | 0 665 187 B1 | 12/1997 |
| 2005/0056866 | A1 | 3/2005 | Bertin et al. | EP | 0665187 B1 | 12/1997 |
| 2005/0056877 | A1 | 3/2005 | Rueckes et al. | EP | 0947466 A1 | 6/1999 |
| 2005/0058590 | A1 | 3/2005 | Sen et al. | EP | 0 947 466 A1 | 10/1999 |

| | | |
|---|---|---|
| EP | 0 989 579 A3 | 3/2000 |
| EP | 0 945 402 A1 | 9/2000 |
| EP | 1 046 613 A2 | 10/2000 |
| EP | 1 225 613 A1 | 10/2000 |
| EP | 1 052 520 A1 | 11/2000 |
| EP | 1 054 249 A1 | 11/2000 |
| EP | 1 059 266 A3 | 12/2000 |
| EP | 1 061 040 A1 | 12/2000 |
| EP | 1 061 043 A1 | 12/2000 |
| EP | 1 061 044 A1 | 12/2000 |
| EP | 1 061 544 A1 | 12/2000 |
| EP | 1 061 555 A1 | 12/2000 |
| EP | 1061040 A1 | 12/2000 |
| EP | 1061043 A1 | 12/2000 |
| EP | 1 069 206 A2 | 1/2001 |
| EP | 1 072 693 A1 | 1/2001 |
| EP | 1 096 533 | 2/2001 |
| EP | 1 132 920 A2 | 2/2001 |
| EP | 1 100 106 A2 | 5/2001 |
| EP | 1 100 297 A2 | 5/2001 |
| EP | 1 205 436 A1 | 11/2001 |
| EP | 1186370 | 3/2002 |
| GB | 2 364 933 A | 7/2001 |
| GB | 2364933 | 2/2002 |
| JP | 1146426 | 6/1989 |
| JP | 11-011917 | 1/1999 |
| JP | 2000-203821 | 7/2000 |
| JP | 2001-035362 | 2/2001 |
| JP | 2002170480 | 6/2002 |
| JP | 2004-090208 | 3/2004 |
| WO | WO95/02709 A2 | 1/1995 |
| WO | WO95/02709 A3 | 1/1995 |
| WO | WO96/38410 | 12/1996 |
| WO | WO96/41043 | 12/1996 |
| WO | WO97/22971 | 12/1996 |
| WO | WO97/09272 | 3/1997 |
| WO | WO97/31139 | 8/1997 |
| WO | WO97/43473 | 11/1997 |
| WO | WO98/26871 | 6/1998 |
| WO | WO98/39250 | 9/1998 |
| WO | WO-98/39250 A1 | 9/1998 |
| WO | WO98/39251 | 9/1998 |
| WO | WO98/42620 | 10/1998 |
| WO | WO-98/44593 | 10/1998 |
| WO | WO98/48456 | 10/1998 |
| WO | WO99/06618 | 2/1999 |
| WO | WO 00/09443 | 7/1999 |
| WO | WO 00/08650 | 8/1999 |
| WO | WO99/47570 | 9/1999 |
| WO | WO99/48810 | 9/1999 |
| WO | WO99/58748 | 11/1999 |
| WO | WO99/65821 | 12/1999 |
| WO | WO-99/65821 A1 | 12/1999 |
| WO | WO 00/09443 | 2/2000 |
| WO | WO 00/17101 | 3/2000 |
| WO | WO 00/19494 | 4/2000 |
| WO | WO 00/63115 | 4/2000 |
| WO | WO 00/73204 A1 | 5/2000 |
| WO | WO 01/03208 C2 | 6/2000 |
| WO | WO 00/44094 | 7/2000 |
| WO | WO-00/09841 | 8/2000 |
| WO | WO-00/48195 | 8/2000 |
| WO | WO 00/48195 A1 | 8/2000 |
| WO | WO 00/48195 C2 | 8/2000 |
| WO | WO 01/18246 | 8/2000 |
| WO | WO 01/23303 | 8/2000 |
| WO | WO 00/63115 | 10/2000 |
| WO | WO 00/73204 C2 | 12/2000 |
| WO | WO 01/03208 | 1/2001 |
| WO | WO 01/03208 A1 | 1/2001 |
| WO | WO 02/37500 | 5/2001 |
| WO | WO 01/44796 | 6/2001 |
| WO | WO 02/19420 | 8/2001 |
| WO | WO 02/38496 | 11/2001 |
| WO | WO 02/42204 | 11/2001 |
| WO | WO 02/48701 | 12/2001 |
| WO | WO 02/48822 | 12/2001 |
| WO | WO 02/054505 | 12/2001 |
| WO | WO 02/059898 | 1/2002 |
| WO | WO 02/060812 | 1/2002 |
| WO | WO 02/060813 | 1/2002 |
| WO | WO-02/45113 A1 | 6/2002 |
| WO | WO-02/48701 A2 | 6/2002 |
| WO | WO-03/016901 | 2/2003 |
| WO | WO-03/091486 | 11/2003 |
| WO | WO-2004/039893 | 5/2004 |
| WO | WO-2004/065655 | 8/2004 |
| WO | WO-2004/065657 | 8/2004 |
| WO | WO-2004/065671 | 8/2004 |

OTHER PUBLICATIONS

Winslow, Troy. "Advanced+ Boot Block World's First 0.18-Micron Flash Memory." Flash Products Group. Apr. 17, 2000.

"Double Sided 4Mb SRAM Coupled Cap PBGA Card Asssembly Guide." International Business Machines Corp. (IBM), 1998.

Dai, Hongjie. "Controlled Chemical Routes to Nanotube Architectures, Physics, and Devices." *The Journal of Physical Chemistry B* (1999); 103: 11246-11255.

Colomer, J.-F., at al., "Characterization of Single-Walled Carbon Nanotubes Produced by CCVD Method." *Chemical Physics Letters* (2001); 345, 11-17.

Cassell, A., et al., "Large Scale Synthesis of Single-Walled Carbon Nanotubes." *The Journal of Physical Chemistry B* (1999); vol. 103, No. 22: 6484-6492.

Homma, Y., et al., "Growth of Suspended Carbon Nanotube Networks on 100nm-Scale Silicon Pillars." *Applied Physics Letters*. (2002); vol. 81 No. 12, 2261-2263.

Kong, J., et al., "Syntheses of Individual Single-Walled carbon Nanotubes on Patterned Wafers." *Nature* (1998); 395: 878-881.

Peigney, A., et al., "A Study of the Formation of Single-and-Double-Walled carbon Nanotubes by a CVD Method." *The Journal of Physical Chemistry B* (2001); 105: 9699-9710.

Franklin, N., et al., "Integration of Suspended Carbon Nanotube Arrays into Electronic Devices and Electroechanical Systems." *Applied Physics Letters* (2002); vol. 81 No. 5, 913-905.

Reuckes, T., et al., "Carbon Nanotube-Based Nonvolatile Random Access Memory for Molecular Computing." *Science*, vol. 289, 94-97, Jul. 7, 2000.

Soh, et al., "Integrated Nanotube Circuits: controlled growth and ohmic contacting of single-walled carbon nanotubes", Applied Physics Letters, Aug. 2, 1999, vol. 75, No. 5, 627-629.

Snow, E.S. et al., "Random Networks of Carbon Nanotubes as an Electronic Material." Applied Physics Letters, Mar. 31, 2003, vol. 82, No. 13, 2145-2147.

Bernholc et al., "Mechanical and Electrical Properties of Nanotubes", Annu. Rev. Mater. Res., 32 (2002) 347.

Wolf, S., Silicon Processing for the VLSI Era, vol. 2—Process Integration, Lattice Press, Sunset Beach, 1990, 189-191, 260-273.

Ajayan, P.M., et al., "Nanometre-Size Tubes of Carbon", Rep. prog. Phys. 60 91997) 1025-1062.

"Double Sided 4Mb SRAM Coupled Cap PBGA Card Assembly Guide." International Business Machines Corp. (IBM), 1998.

Tyagi et al. "A 130nm Generation Logic Technology Featuring 70nm Transistors, Dual Vt Transistors and 6 Layers of Cu Interconnects." Portland Technology Development.

"Preliminary: 8MB (256K×36 & 512K×18) and 4Mb (128K×36 & 256K×18) [IBM0418A8CBLBB, IBM0418A4CBLBB, IBM0436A8CBLBB, IBM0436A4CBLBB]." International Business Machines Corp. (IBM), 1998.

Wei, Chengyu et al. "Temperature and Stain-Rate Dependent Plastic Deformation of Carbon Nanotube."

"Package Mechanicals for USAR ICs." USAR Systems, Inc., 1998.

Dipert, Brian. "Exotic Memories, Diverse Approaches." EDN Magazine. Apr. 26, 2001, 56-70.

Duan, Xiangfeng. "Indium Phosphide Nanowires as Building Blocks for Nanoscale Electronic and Optoelectronic Devices." *Nature* (2001); 409: 66-69.

Yang. "A High Performance 180 nm Generation Logic Technology." Portland Technology Development.

Callaby, D. Roy et al. "Solid State Memory Study Final Report." National Media Lab, Feb. 1994.

Cui, Yi. "Doping and Electrical Transport in Silicon Nanowires." The Journal of Physical Chemistry B (2000); vol. 104, No. 22: 5213-5216.

Li, Mingtao et al. "Direct Three-dimensional Patterning Using Nanoimprint Lithography." *Applied Physics Letters* (2000); vol. 78, No. 21: 3322-3324.

"8 Mb Synchronous Communication SRAM (IBM0418A86LQKA, IBM0418A86SQKA, IBM0436A861QKA, IBM436A86SQKA)." International Business Machines Corp. (IBM), 1999.

Dipert, Brian. "Memory Cards: Designing with a Full Deck." EDN Magazine. May 25, 2000.

Schönenberger, Christian et al. "Physics of Multiwall Carbon Nanotubes." *Physics World*. Apr. 4, 2000.

Whatmore, Roger W. "Nanotechnology." *Ingenia*. Feb. 2000.

"Nanochip NC800SX, 0.8 Gbyte Molecular Memory IC (R/W), Nanochip NC200SX, 0.2 Gbyte Molecular Memory IC (R/W), Nanochip NCM4510SX, Molecular Array Read/write Engine, Low Voltage Thermal Actuated, Dynamic Media Series M2, Nanochip NC4525DX, A/D-D/A Interface, Preliminary Specifications, Advance Information, (c) 1996-2000 Nanochip Document NCM2230500."

Odom, Teri Wang et al. "Atomic Structure and Electronic Properties of Single-Walled Carbon Nanotubes." *Nature* (1998); 391: 62-64.

Ouyang, Min. "Atomically Resolved Single-Walled Carbon Nanotube Intramolecular Junctions." *Science* (2001); 291: 97-100.

Odom, Teri Wang et al. "Magnetic Clusters on Single-Walled Carbon Nanotubes: The Kondo Effect in a One-Dimensional Host." *Science* (2000); 290: 1549-1552.

Wong, Eric et al. "Nanobeam Mechanics: Elasticity, Strength, and Toughness of Nanorods and Nanotubes." *Science* (1997); 277: 1971-1975.

Hu, Jiangtao et al. "Controlled Growth and Electrical Properties of Heterojunctions of Carbon Nanotubes and Silicon Nanowires." *Nature* (1999); 399: 48-51.

Rueckes, Thomas et al. "Carbon Nanotube-Based Nonvolatile Random Access Memory for Molecular Computing." *Science* (2000); 289: 94-7.

Kim, Philip et al. "Nanotube Nanotweezers." *Science* (1999); 286: 2148-2150.

Huang, Yu et al. "Directed Assembly of One-Dimensional Nanostructures into Functional Networks." *Science* (2001); 291: 630-33.

Cui, Yi et al. "Functional Nanoscale Electronic Devices Assembled Using Silicon Nanowire Building Blocks." *Science* (2001); 291: 851-53.

Oullette, Jennifer. "Exploiting Molecular Self-Assembly." *The Industrial Physicist*. American Institute of Physics, Dec. 2000.

Peng, Shu et al. "Chemical Control of Nanotube Electronics." *Nanotechnology* (2000); 11: 57-60.

"The Ultimate Memory Guide." Kingston Technology (1998).

Morales, Alfredo et al. "A Laser Ablation Method for the Synthesis of Crystalline Semiconductor Nanowires." *Science* (1998); 279: 208-11.

Franklin, Nathan R. and Hongjie Dai, "An Enhanced CVD Approach to Extensive Nanotube Networks with Directionality." *Advanced Materials* (2000): 890-894.

Kong, Jing; Chongwu Zhou; Erhan Yenilmez; Hongjie Dai. "Alkaline metal-doped n-type semiconducting nanotubes as quantum dots." *ApplieDPhysics Letters* (Dec. 11, 2000): 3977-3979.

Tombler, Thomas W.; Chongwu Zhou; Jing Kong; Hongjie Dai. "Gating individual nanotubes and crossed with scanning probes." *Applied Physics Letters* (Apr. 24, 2000): 2412-2414.

Zhou, Chongwu: et al. "Electrical measurements of individual semiconducting single-walled carbon nanotubes of various diameters." *Applied Physics Letters* (Mar. 20, 2000): 1597-1599.

Zhang, Y. and Hongjie Dai. "Formation of metal nanowires on suspended single-walled carbon nanotubes." *Applied Physics Letters* (Nov. 6, 2000): 3015-3017.

Chen, Robert J. et al. "Molecular photodesorption from single-walled carbon nanotubes." *Applied Physics Letters* (Oct. 1, 2001): 2258-2260.

Zhang, Y. et al. "Electric-field-directed growth of aligned single-walled carbon nanotubes." *Applied Physics Letters* (Nov. 5, 2001): 3155-3157.

Zhang, Y. et al. "Metal coating on suspended carbon nanotubes and its implication to metal-tube interaction." *Chemical Physics Letters* (Nov. 24, 2000): 35-41.

Chen, Robert J. et al. "Nanocovalent Sidewall Functionalization of Single-Walled Carbon Nanotubes for Protein Immobilization." *American Chemical Society* (2001): 3838-3839.

Li, Yiming et al. "Growth of Single-Walled Carbon Nanotubes from Discrete Catalytic Nanoparticles of Various Sizes." *American Chemical Society* (2001).

Cassell, Alan M. et al. "Large Scale CVD Synthesis of Single-Walled Carbon Nanotubes." *American Chemical Society* (1999): 6484-6492.

Fan, Shoushan et al. "Carbon nanotube arrays on silicon substrates and their possible application." *Physica E* (2000): 179-183.

Liu, Lei et al. "Controllable Reversibility of an sp2 to sp3 Transition of a single Wall Nanotube under the Manipulation of an AFM Tip." *Physical Review Letters* (May 22, 2000): 4950-4953.

Kong, Jing et al. "Quantum Interference and Ballistic Transmission in Nanotube Electron Waveguides." *Physical Review Letters* ( Sep. 3, 2001); 87, 106801(4).

Liu, C. et al. "Synthesis of Macroscopically Long Ropes of Well-Aligned Single-Walled Carbon Nanotubes." *Advanced Materials* (Aug. 16, 2000); 12, 1190-1192.

Kiang, Ching-Hwa. "Growth of Large-Diameter Single-Walled Carbon Nanotubes." *American Chemical Society* (2000); 104, 2454-2456.

Cheung. Chin Li et al. "Growth and fabrication with single-walled carbon nanotube probe microscopy tips." *Applied Physics Letters* (2000); 76, 3136-3138.

Bozovic, Dolores et al. "Electronic properties of mechanically induced kinds on single-walled carbon nanotubes." *Applied Physics Letters* (Jun. 4, 2001); 78, 3693-3695.

Hafner, Jason H. et al. "High-Yield Assembly of Individual Single-Walled Carbon Nanotube Tips for Scanning Prone Microscopies." *The Journal of Physical Chemistry* (Feb. 1, 2001); 105, 743-746.

Carbon Nanotube Tips for Scanning Prone Microscopies. *The Journal of Physical Chemistry* (Feb. 1, 2001); 105, 743-746.

Hafner, J.H. et al. "Structural and functional imaging with carbon nanotube AFM probes." *Progress in Biophysics & Molecular Biology* (2001); 77, 73-110.

Jorio, A. et al. "Joint density of electronic states for one isolated single-wall carbon nanotube studied by resonant Raman scattering." *Physical Review B* (2001); 63: 24541(4).

Filho, A. G. Souza et al. "Electronic transition energy Eii for an isolated (n, m) single-wall carbon nanotube obtained by anti-Stokes/Stokes resonant Raman intensity ratio." *Physical Review* (2002); 63, 241404(4).

Saito, R. et al. "Chirality-dependent G-band Raman intensity of carbon nanotubes." *Physical Review* (2001); 64, 085312(7).

Jorio, A. et al. "Structural (n, m) Determination of Isolates Single-Wall Carbon Nanotubes by Resonant Raman Scattering." *Physical Review Letters* (Feb. 5, 2001); 86, 1118-1121.

Woolley, Adam T. et al. "Structural biology with carbon nanotube AFM probes." *Chemistry & Biology* (2000); 7, R193-204.

Li, Yan et al. "Preparation of Monodispersed Fe-Mo Nanoparticles as the Catalyst for CVD Synthesis of Carbon Nanotubes." *Chemical Material* (2001): 13; 1008-1014.

Rao, C. N. R. et al. "Nanotubes." *CHEMPHYCHEM* (2001); 2, 78-105.

Nerushev, Oleg A. et al. "Carbon nanotube films obtained by thermal chemical vapor deposition." *Journal of Chemistry Materials* (2001); 11, 1122-1132.

Flahaut, E. et al. "Synthesis of single-walled carbon nanotube-Co-MgO composite powders and extraction of the nanotubes." *Journal of Chemical Materials* (2000); 10, 249-252.

Dresselhaus, Mildred S. and Phaedon Avouris. "Introduction to Carbon Materials Research." *Topics Applied Physics* (2001); 80, 1-9.

Dresselhaus, Mildred S. and Morinobu Endo. "Relation of Carbon Nanotubes to Other Carbon Materials." *Topics in Applied Physics* (2001); 80, 11-28.

Dai, Hongjie. "Nanotube Growth and Characterization." *Topics in Applied Physics* (2001); 80, 29-53.

Charlier, Jean-Chrisophe and Sumio Iijima. "Growth Mechanisms of Carbon Nanotubes." *Topics in Applied Physics* (2001); 80, 55-81.

Tenne, Richard and Alex K. Zettl. "Nanotubes from Inorganic Materials." *Topics in Applied Physics* (2001); 80, 81-112.

Louie, Steven G. "Electronic Properties, Junctions, and Defects of Carbon Nanotubes." *Topics in Applied Physics* (2001); 80, 113-145.

Yao, Zhen et al. "Electrical Transport Through Single-Wall Carbon Nanotubes." *Topics in Applied Physics* (2001); 80, 147-171.

Odom, Teri Wang et al. "Scanning Probe Microscopy Studies of Carbon Nanotubes." *Topics in Applied Physics* (2001); 80, 173-211.

Saito, Riichiro and Hiromichi Kataura. "Optical Properties and Raman Spectroscopy of Carbon Nanotubes." *Topics in Applied Physics* (2001); 80, 213-247.

Fink, Joerg H. and Philippe Lambin. "Electron Spectroscopy Studies of Carbon Nanotubes." *Topics in Applied Physics* (2001); 80, 247-272.

Hone, James. "Phonons and Thermal Properties of Carbon Nanotubes." *Topics of Applied Physics* (2001); 80, 273-286.

Yokobson, Boris I. And Phaedon Avouris. "Mechanical Properties of Carbon Nanotubes." *Topics in Applied Physics* (2001); 80, 287-327.

Forro, Laszlo and Christian Schoenenberger. "Physical Properties of Multi-wall Nanotubes." *Topics in Applied Physics* (2001); 80, 329-391.

Ajayan, Pulickel M. and Otto Z. Zhou. "Applications of Carbon Nanotubes." *Topics in Applied Physics* (2001); 80, 391-425.

Kong, J. et al. "Synthesis, integration, and electrical properties of individual single-walled carbon nanotubes." *Applied Physics A* (1999); 69, 305-308.

Dai, Hongjie et al. "Exploiting the properties of carbon nanotubes for nanolithography." *Applied Physics Letters* (Sep. 14, 1998); 73, 1508-1510.

Soh, Hyongsok T. et al. "Integrated nanotube circuits." *Applied Physics Letters* (Aug. 2, 1999); 75, 627-629.

Bozler, C.O., et al., "Fabrication and Microwave Performance of the Permeable Base Transistor," *IEEE Tech. Dig. Int. Electron Devices Meeting* (1979) 384.

Cheng, H. M. et al. "Large-scale and low-cost synthesis of single-walled carbon nanotubes by the catalytic pyrolysis of hydrocarbons." *Applied Physics Letters* (Jun. 22, 1998); 72, 3282-3284.

Shim, Moonsub et al. "Polymer Functionalization for Air-Stable n-Type Carbon Nanotube Field-Effect Transistors." *Journal of American Chemical Society* (2001); 123, 11512-11513.

Haddon, R. C. "C70 Thin Film Transistors." *Journal of the American Chemical Society* (1996); 118, 3014-3042.

Hafner, Jason H. et al. "Direct Growth of Single-Walled Carbon Nanotube Scanning Probe Microscopy Tips." *Journal of the American Chemical Society* (1999); 121, 9750-9751.

Hafner, Jason H. et al. "Growth of nanotubes for probe microscopy tips." *Scientific Correspondence* (Apr. 29, 1999); 398, 761, 762.

Bekyarova, E. et al. "Oxidation and Porosity Evaluation of Budlike Single-Wall Carbon Nanohorn Aggregates." *American Chemical Society* (2002).

Hafner, Jason H. et al. "Catalytic growth of single-wall carbon nanotubes from metal particles." *Chemical Physics Letters* (Oct. 30, 1998); 296, 195-202.

Kiang, Ching-Hwa. "Growth of Large-Diameter Single-Walled Carbon Nanotubes." *Journal of Physical Chemistry A.* 92000); 104, 2454-2456.

Nerushev, Oleg A. et al. "Carbon nanotubes films obtained by thermal chemical vapour deposition." *Journal of Material Chemistry* (2001); 11, 1122-1132.

Zhou, Chongwu et al. "Electrical measurements of individual semiconducting single-walled carbon nanotubes of various diameters." *Applied Physics Letters* (Mar. 20, 2000); 76, 1597-1599.

Yu, et al., *J. Phys. Chem. B*, 105:6831-6837 (2001).

Berber, S., *Phys. Rev. Lett*, 84, 4613 (2000).

Bahr, Jeffrey L. and James. M. Tour. "Highly Functionalized Carbon Nanotubes Using in Situ Generated Diazonium Compounds." *Chemical Materials* (2001); 13, 3823-3824.

Peigney, Alain et al. "A Study of the Formation of Single- and Double-Walled Carbon Nanotubes by a CVD Method." *Journal of Physical Chemistry B* (2001); 105, 9699-9710.

Yao, B. D. and N. Wang. "Carbon Nanotube Arrays Prepared by MWCVD." *Journal of Physical Chemistry* (2001); 105, 11395-11398.

Ago, Hiroki et al. "Gas-Phase Synthesis of Single-wall Carbon Nanotubes from Colloidal Solution of Metal Nanoparticles." *Journal of Physical Chemistry B* (Nov. 1, 2001); 105, 10453-10456.

Li, Yiming et al. "Growth of Single-Walled Carbon Nanotubes from Discrete Catalytic Nanoparticles of Various Sizes." *Journal of Physical Chemistry B* (2001); 105, 11424-11431.

Ng. Hou Tee et al. "Soft-Lithography-Mediated Chemical Vapor Deposition of Architectured Carbon Nanotube Networks on Elastomeric Polymer." *American Chemical Society* (2001).

Derycke, V. et al. "Carbon nanotube Inter-and Intramolecular Logic Gates." *Nano Letters* (Sep. 2001); 1, 453-456.

Erkoc et al., *Int. J. Modern Phys. C*, 12:865-870 (2001).

Benerjee, Sarbajit and Stanislaus S. Wong. "Functionalization of Carbon Nanotubes with a Metal-Containing Molecular Complex." *Nano Letters* (2001); 0, A-E.

Reynoso, J. 391PGA Drawings (3): Project No. 32639103. *Kyocera America, Inc.* (Apr. 12, 1994).

Diehl, Michael R. et al. "Self-Assembled, Deterministic Carbon Nanotube Wiring Networks." *Angew. Chemical International Edition* (2002); 41, 353-356.

Table of Contents for Semiconductor Consulting Services (1999).

Sidorov, S. N. et al. "Cobalt Nanoparticle Formation in the Pores of Hyper-Cross-Linked Polystyrene." *Chemical Materials* (1999); 11, 3210-3215.

Brown, David A. et al. "Kinetics of Inron(III) Chelation from Polynuclear Oxo-Hydroxy Aggregates by Hydroxamic Acids." *Inorganic Chemistry* (1999); 38, 5198-5202.

Douglas, Trevor and Vistoria T. Stark. "Nanophase Cobalt Oxyhydroxide Mineral Synthesized within the Protein Cage of Ferritin." *Inorganic Chemistry* (2000); 39, 1828-1830.

Hatzikonstantinidou et al., Phys. Scripta 54: 226-229 (1994).

Cao, Anyuan et al. "Macroscopic Three-dimensional Arrays of Fe Nanoparticles Supported in Aligned Carbon Nanotubes." *The Journal of Physical Chemistry B* (2001); 105, 11937-11940.

Li, Shoutian et al. "Semiconductor Nanoparticles in Contact: Quenching of the Photoluminescence from Silicon Nanocrystals by WO3 nanoparticles Suspended in Solution." *The Journal of Physical Chemistry B* (1998); 102, 7319-8322.

Zhang, Shengjun et al. "Select Pathways to Caron Nanotube Film Growth." *Advanced Materials* (Dec. 3, 2001); 13, 1767-1770.

Wei, B. Q. et al. "Organized assembly of carbon nanotubes." *Nature* (Apr. 4, 2002); 416, 495-496.

Zhao, Y.-P. et al. "Frequency-dependent electrical transport in carbon nanotubes." *Physical Review B* (2001); 64, 201402(4).

Zhu, H. W. et al. "Direct Synthesis of Long Single-Walled Carbon Nanotube Strands." *Science* (May 3, 2002); 296, 884-886.

Ajayan, P. M. et al. "Nanotubes in a Flash—Ignition and Reconstruction." *Science* (Apr. 26, 2002); 296, 705.

Franklin, Nathan R. et al. "Patterned growth of single-walled carbon nanotubes on full 4-inch wafers." *Applied Physics Letters* (Dec. 31, 2001); 79, 4571-4573.

Fan, Shoushan et al. "Self-Oriented Regular Arrays of Carbon Nanotubes and Their Field Emission Properties." *Science* (Jan. 22, 1999); 283, 512-514.

Sohn, Jung Inn, et al., "Patterned selective growth of carbon nanotubes and large field emission from vertically well-aligned carbon nanotube field emitter arrays." *Appl. Phys. Letters* (Feb. 12, 2001); 78, 901-903.

Postma, Henk W. C. et al. "Manipulation and Imaging of Individual Single-Walled Carbon Nanotubes with an Atomic Force Microscope." *Advanced Materials* (Sep. 1, 2000); 1299-1302.

Chen, J. et al., "Large On-Off Ratios and Negative Differential Resistance in a Molecular Electronic Device," *Science*, vol. 286, Nov. 19, 1999, pp. 1550-1551.

Collier, C.P., et al., "Electronically Configurable Molecular-Based Logic Gates," Science, vol. 285, Jul. 16, 1999, pp. 391-394.
"IBM Builds Tiny Transistor that Beats Silicon", Technology—Reuters, Yahoo, May 16, 2002.
Yao, Z., et al, Phys. Rev. Lett, 84, 2941 (2000).
Tans, Sander J., "Room-temperature transistor based on a single carbon nanotube," Nature, May 1998, vol. 393, pp. 49-52.
Dillon, Anne C., "A Simple and Complete Purification of Single-Walled Carbon Nanotube Materials," Advanced Materials, 1999, vol. 11, pp. 1354-1358.
Cleland, A.N., "Single-crystal aluminum nitride nanomechanical resonators," Applied Physics letters, Sep. 24, 2001, vol. 79, pp. 2070-2072.
Kluth, P., "Fabrication of epitaxial $CoSi_2$ nanowires," Applied Physics Letters, Aug. 6, 2001, vol. 79, pp. 824-826.
Zhang, Y., "Formation of metal nanowires on suspended single-walled carbon nanotubes," Applied Physics Letters, Nov. 6, 2000, vol. 77, pp. 3015-3017.
Berry, A.D., "Fabrication of GaAs and InAs wires in nanochannel gas," Applied Physics Letters, Nov. 4, 1996, vol. 69, pp. 2846-2848.
Li, Jian-Long, "Spontaneous formation of ordered indium nanowire array on Si(001)," Applied Physics Letters, Oct. 22, 2001, vol. 79, pp. 2826-2828.
Jorritsma, J., "Fabrication of large arrays of metallic nanowires on V-grooved substrates," Applied Physics Letters, Sep. 4, 1995, vol. 67, pp. 1489-1491.
Sekiba, Daiichiro, "Fabrication of stable nanopatterns on metals," Applied Physics Letters, Sep. 30, 2002, vol. 81, pp. 2632-2634.
Yin, A. J., "Fabrication of highly ordered metallic nanowire arrays by electrodeposition," Applied Physics Letters, Aug. 31, 2001, vol. 79, pp. 1039-1041.
He, J. Z., "Dispersion, refinement, and manipulation of single silicon nanowires," Applied Physics Letters, Mar. 11, 2002, vol. 80, pp. 1812-1814.
Franklin, Nathan R., "Integration of suspended carbon nanotube arrays into electronic devices and electromechanical systems," Applied Physics Letters, Jul. 29, 2002, vol. 81, pp. 913-915.
Homma, Yoshikazu, "Growth of suspended carbon nanotube networks on 100-nm-scale silicon pillars," Applied Physics Letters, Sep. 16, 2002, vol. 81, pp. 2261-2263.
Yenilmez, Erhan, "Wafer scale production of carbon nanotube scanning probe tips for atomic force microscopy," Applied Physics Letters, Mar. 25, 2002, vol. 80, pp. 2225-2227.
Dinaro, Joanna, "Analysis of an Elementary Reaction Mechanism for Benzene Oxidation in Supercritical Water, Combustion Institute," 2000, vol. 28, pp. 1529-1536.
Monthioux, M., "Sensitivity of single-wall carbon nanotubes to chemical processing: an electron microscopy investigation," Carbon, 2001, vol. 39, pp. 1251-1272.
Hou, P. X., "Multi-step purification of carbon nanotubes," 2002 Elsevier Science Ltd., Mar. 8, 2001, vol. 40, pp. 81-85.
Avouris, P., "Carbon nanotubes electronics," Carbon, 2002, vol. 40, pp. 429-445.
Chen, Bin, "Heterogeneous Single-Walled Carbon Nanotube Catalyst Discovery and Optimization," Chemical Materials, Dec. 7, 2001, vol. 14, pp. 1891-1896.
Maurin, I., "Carbon Miscibility in the Boron Layers of the $MgB_2$ Superconductor," Chemical Materials, 2002, pp. A-D.
Hyeon-Lee, Jingyu, "Aero-Sol-Gel Synthesis of Nanostructured Silica Powders," Chemical Materials, 1997, vol. 9, pp. 2400-2403.
McEuen, Paul L., Single-Walled Carbon Nanotube Electronics, to be published in the inaugural issue of the IEEE Transactions on Nanotechnology (2002), 9 pgs.
Dürkop, T., "Nanotubes are High Mobility Semiconductors," Department of Physics, University of Maryland, 4 pgs.
Choi, Hee Cheul, "Spontaneous Reduction of Metal Ions on the Sidewalls of Carbon Nanotubes," J. Amer. Chem. Soc., May 7, 2002, pp. A-B.
Zheng, Bo, "Efficient CVD Growth of Single-Walled Carbon Nanotubes on Surfaces Using Carbon Monoxide Precursor,"Nano Letters, 2002, pp. A-D.
Deng, S. Z., "Synthesis of silicon carbide nanowires in a catalyst-assisted process," Chemical Physics Letters, Apr. 26, 2002, vol. 356, pp. 511-514.
Zhang, R. Q., "Silicon nanotubes: Why not?," Chemical Physics Letters, 2002, vol. 364, pp. 251-258.
Lei, Y., "Fabrication, characterization and Raman study of $TiO_2$ nanowire arrays prepared by anodic oxidative hydrolysis of $TiCl_3$," Chemical Physics Letters, 2001, vol. 338, pp. 231-236.
Zheng, M. J., "Fabrication and optical properties of large-scale uniform zinc oxide nanowire arrays by one-step electrochemical deposition technique," Chemical Physics Letters, 2002, vol. 363, pp. 123-128.
O'Connell, Michael J., "Reversible water-solubilization of single-walled carbon nanotubes by polymer wrapping," Chemical Physics Letters, 2001, vol. 342, pp. 265-271.
Huang, Houjin, "Purification and alignment of arc-synthesis single-walled carbon nanotube bundles, " Chemical Physics Letter, 2002, vol. 356, pp. 567-572.
Kong, Jing, "Chemical vapor deposition of methane for single-walled carbon nanotubes," Chemical Physics Letters, 1998, vol. 292, pp. 567-574.
Bergbreiter, David E., "Using Soluble Polymers To Recover Catalysts and Ligands," Chemical Reviews, Mar. 5, 2002, pp. A-AM.
Roucoux, Alain, "Reduced Transition Metal Colloids: A Novel Family of Reusable Catalysts?," Chemical Reviews, Jan. 30, 2002, pp. A-V.
Yoshida, Jun-ichi, "Tag Strategy for Separation and Recovery," Chemical Reviews, Mar. 18, 2002, pp. A-X.
De Vos, Dirk E., "Ordered Mesoporous and Microporous Molecular Sieves Functionalized with Transition Metal Complexes as Catalysts for Selective Organic Transformations," Chemical Reviews, Jan. 31, 2002, pp. A-Z.
Connelly, Neil G., "Chemical Redox Agents for Organometallic Chemistry," Chemical Reviews, Jan. 9, 1996, vol. 96, pp. 877-910.
Dequesnes, Marc, "Calculation of pull-in voltages for carbon-nanotube-based nanoelectromechanical switches," Nanotechnology, Jan. 22, 2002, vol. 13, pp. 120-131.
Serp, Philippe, "Chemical Vapor Deposition Methods for the Controlled Preparation of Supported Catalytic Materials," Chemical Reviews, Apr. 10, 2002, pp. A-AR.
Diehl, Michael R., "Self-Assembled, Deterministic Carbon Nanotube Wiring Networks," Angew. Chem. Int. Ed., 200 vol. 41, pp. 353-356.
Wind, S.J., "Localized and Directed Lateral Growth of Carbon Nanotubes from a Porous Template," IBM T.J. Watson Research Center, 17 pgs.
Wind, S. J., "Fabrication and Electrical Characterization of Top Gate Single-Wall Carbon Nanotube Field-Effect Transistors," IBM T. J. Watson Research Center, 14 pgs.
Harutyunyan, Avetik R., "CVD Synthesis of Single Wall Carbon Nanotubes under "Soft" Conditions," Nano Letters, Feb. 25, 2002, pp. A-F.
Massot, L., "Electrodeposition of carbon films from molten alkaline fluoride media," Electrochimica Acta, Jan. 28, 2002, vol. 47, pp. 1949-1957.
Heinze, S., "Carbon Nanotubes as Schottky Barrier Transistors," Physical Review Letters, Sep. 2, 2002, vol. 89, pp. 106801-1 through 106801-4.
Duan, Xiangfeng, "Indium phosphide nanowires as building blocks for nanoscale electronic and optoelectronic devices," Nature, Jan. 4, 2001, vol. 408, pp. 66-69.
Chen, Robert J., "Noncovalent Sidewall Functionalization of Single-Walled Carbon Nanotubes for Protein Immobilization," J. Amer. Chem. Soc., 2001, vol. 123, pp. 3838-3839.
Puntes, Victor F., "Synthesis of hcp-Co Nanodisks," J. Amer. Chem. Soc., 2002, vol. 124, pp. 12874-12880.
An, Lei, "Synthesis of Nearly Uniform Single-Walled Carbon Nanotubes Using Identical Metal-Containing Molecular Nanoclusters as Catalysts," j. Amer. chem. soc., 2002, total of 4 pgs.
Cassell, Alan M., "Directed Growth of Free-Standing Single-Walled Carbon Nanotubes," American Chemical Society, Jun. 21, 1999, vol. 121, pp. 7975-7976.

Bahr, Jeffrey L., "Functionalization of Carbon Nanotubes by Electrochemical Reduction of Aryl Diazonium Salts: A Bucky Paper Electrode," American Chemical Society, 2001, vol. 123, pp. 6536-6542.

Fruchart, O., "Vertical self-organization of epitaxial magnetic nanostructures," Journal of Magnetism and Magnetic Materials, 2002, vol. 239, pp. 224-227.

Zhang, J., "Fabrication and photoluminescence of ordered GaN nanowire arrays," Journal of Chemical Physics, Oct. 1, 2001, vol. 115, pp. 5714-5717.

Dubois, S., "Fabrication and properties of arrays of superconducting nanowires," Journal of Materials Research Mar. 1999, vol. 14, pp. 665-671.

Liu, Z.Q., "Synthesis of $\alpha$-$SiO_2$ nanowires using Au nanoparticle catalysts of a silicon substrate," Journal of Materials Research, Mar. 2001, vol. 16, pp. 683-686.

Lei, Y, Fabrication, characterization, and photoluminescence properties of highly ordered $TiO_2$ nanowire arrays, J. Material Research, Apr. 2001, vol. 16, pp. 1138-1144.

Li, Y., "Fabrication of Highly ordered ZnO nanowire arrays in anodic alumina membranes," J. Materials Research, Nov. 2000, vol. 15, p. 2305-2308.

Sellmyer, D.J., "Magnetism of Fe, Co and Ni nanowires in self-assembled arrays," J. of Physics: Condensed Matter, (2000) vol. 13, pp. R433-R460.

Blick, R.H., "Nanostructural silicon for studying fundamental aspects of nanomechanics," J. of Physics: Condensed Matter, (2002), pp. R905-R945.

Ciraci, S., "Quantum effects in electrical and thermal transport through nanowires," J. of Physics: Condensed Matter, (2001), pp. R537-R568.

Yu, Jae-Young, "Silicon Nanowires: Preparation, Device, Fabrication, and Transport Properteis," J. Phys. Chem. B 2000, vol. 104, pp. 11864-11870.

Yu, Zhonghua, "(n, m) Structural Assignments and Chirality Dependence in Single-Wall Carbon Nanotube Raman Scattering," J. Phys. Chem. B 2001, vol. 105, pp. 6831-6837.

Wang, Y.W., "Fabrication of Ordered Ferromagnetic-Nonmagnetic Alloy Nanowire Arrays and their Magnetic Property Dependence on Annealing Temperature," J. Phys. Chem. B 2002, vol. 106, pp. 2502-2507.

Murphy, Robert, "High-Yield, Nondestructive Purification and Quantification Method for Multiwalled Carbon Nanotubes," J. Phys. Chem. B 2002, vol. 106, pp. 3087-3091.

Li, C.P., "Silicon Nanowires Wrapped with Au Film," J. Phys. Chem. B 2002, vol. 106, pp. 6980-6984.

Steuerman, David W., "Interactions between Conjugated Polymers and Single-Walled Carbon Nanotubes," J. Phys. Chem. B 2002, vol. 106, pp. 3124-3130.

Li, Jun, "Novel Three-Dimensional Electrodes: Electrochemical Properties of Carbon Nanotube Ensembles," J. Phys. Chem. B 2002, pp. A-G.

Cassell, Alan M., "Large Scale CVD Synthesis of Single-Walled Carbor Nanotubes," J. Phys. Chem. B 1999, vol. 103, pp. 6484-6492.

Dai, Hongju, "Controlled Chemical Routes to Nanotube Architectures, Physics, and Devices," J. Phys. Chem. B 1999, vol. 103, pp. 11246-11255.

Chiang, I.W., "Purification and Characterization of Single-Wall Carbon Nanotubes (SWNTs) Obtained from the Gas-Phase Decomposition of CO (HiPco Process)," J. Phys. Chem. B 2001, vol. 105, pp. 8297-8301.

Tulchinsky, D.A., "Fabrication and domain imaging of iron magnetic nanowire arrays," J. Vac. Sci. Technol., May/Jun. 1998, A 1(3), pp. 1817-1819.

Yun, Wan Soo, "Fabrication of metal nanowire using carbon nanotube as a mask," J. Vac. Sci. Technol., Jul./Aug. 2000, A 18(4), pp. 1329-1332.

Batra, Inder P., "Quantum transport through one-dimensional aluminum wires," J. Vac. Sci. Technol., May/Jun. 2002, B 20(3), pp. 812-817.

Tsutsumi, Toshiyuki, "Fabrication technology of ultrafine $SiO_2$ masks and Si nanowires using oxidation of vertical sidewalls of a poly-Si layer," J. Vac. Sci. Technol., Jan./Feb. 1999, B 17(1), pp. 77-81.

Namatsu, Hideo, "Fabrication of one-dimensional nanowire structures utilizing crystallographic orientation in silicon and their conductance characteristics," J. Vac. Sci. Technol., Sep./Oct. 1997, B 15(5), pp. 1688-1696.

Namatsu, Hideo, "Fabrication of thickness-controlled silicon nanowires and their characteristics," J. Vac. Sci. Technol., Nov./Dec. 1995, B 13(6), pp. 2166-2169.

Cassell, Alan M., "Combinatorial Optimization of Heterogeneous Catalysts Used in the Growth of Carbon Nanotubes," Langmuir 2001, vol. 17, pp. 260-264.

Lewenstein, Justin C. High-Yield Selective Placement of Carbon Nanotubes on Pre-Patterned Electrodes, Nano Letters., 2002, vol. 2, No. 5, pp. 443-446.

Martino, Anthony, "Catalyst Testing of Highly Dispersed Metal Nanoparticles for Coal Liquefaction and Coal/Waste Copressing," Catalysis and Chemical Technologies Department, Sandia National Laboratories, pp. 1-7.

Peng, X.S., "Electrochemical fabrication of ordered $Ag_2S$ nanowire arrays," Materials Research Bulletin, 2002, No. 37, pp. 1369-1375.

Robinson, L.A. W., "Self-aligned electrodes for suspended carbon nanotube structures," Microelectronics Research Centre, Cavendish Laboratory, University of Cambridge and Hitachi Cambridge Laboratory, pp. 1-2.

Moore, Gordon E., "Cramming more components into integrated circuits," Electronics, Apr. 19, 1965, vol. 38, No. 8(4), 4 pgs.

Fan, Hongyou, "Multiphased assembly of nanoporous silica particles," Journal of Non-Crystalline Solids (2001) vol. 285, pp. 71-78.

Kong, Jing, "Synthesis of individual single-walled carbon nanotubes on patterned silicon wafers," Nature, Oct. 29, 1998, vol. 395, pp. 878-881.

Duan, Xiangfeng, "Nonvolatile Memory and Programmable Logic from Molecule-Gated Nanowires," Nano Letters, 2002, pp. A-D.

Fuhrer, M.S., "High-Mobility Nanotube Transistor Memory," Nano Letters, 2002, vol. 2, No. 7, pp. 755-759.

Radosavljević, M., Nonvolatile Molecular Memory Elements Based on Ambipolar Nanotube Field Effect Transitors, Nano Letters, 2002, vol. 2, pp. 761-764.

Derycke, V., "Catalyst-Free Growth of Ordered Single-Walled Carbon Nanotube Networks," Nano Letters, 2002, pp. A-D.

Joselevich, Ernesto, "Vectorial Growth of Metallic and Semiconducting Single-Wall Carbon Nanotubes," Nano Letters, xxxx, vol. 0, pp. A-E.

Javey, Ali, "Carbon Nanotube Transistor Arrays for Multistage Complementary Logic and Ring Oscillators," Nano Letters, 2002, pp. A-D.

Robertson, John, "Section 11. Non-Crystalline Carbon, Properties and Prospects for Non-Crystalline Carbons," Journal of Non-Crystalline Solids 299-302, 2002, pp. 798-804.

Ci, Lijie, "Double Wall Carbon Nanotubes Promoted by Sulfur in a Floating Iron Catalyst CVD System," Chemical Physics Letters 359, Jun. 13, 2002, pp. 63-67.

Gromov, A., "Purification of Carbon Nanotubes," Caramel Workshop, Jan. 23, 2002, pp. 1-13.

Cui, Yi, "Functional Nanoscale Electronic Devices Assembled Using Silicon Nanowire Building Blocks," Science, Feb. 2, 2001, vol. 291, pp. 851-853.

Wang, Suhua, Thermal Oxidation of $Cu_2S$ Nanowires: a Template Method for the Fabrication of Mesoscopic $Cu_xO$ (x×1,2) Wires, Phys. Chem. Chem. Phys., 2002, vol. 4, pp. 3425-3429.

Untiedt, C., "Fabrication and Characterization of Metallic Nanowires," Physical Review B, Jul. 15, 1997, vol. 56, No. 4, pp. 2154-2160.

Marsen, Bjorn, "Fullerene-Structured Nanowires of Silicon," Physical Review B, Oct. 15, 1999, vol. 60, No. 16, pp. 11593-11600.

Berber, Savas, "Unusually High Thermal Conductivity of Carbon Nanotubes," Physical Review Letters, May 15, 2000, vol. 84, No. 20, pp. 4613-4616.

Yao, Zhen, "High-Field Electrical Transport in a Single-Wall Carbon Nanotubes," Physical Review Letters, Mar. 27, 2000, vol. 84, No. 13, pp. 2641-2944.

Zhang, Y.F., "Liquid Phase Synethesis of Carbon Nanotubes," Physica B 323, 2002, pp. 293-295.

Dresselhaus, M.S., "Raman Spectroscopy on One Isolated Carbon Nanotube," Physica B 323, 2002, pp. 15-20.

Fu, Qiang, "Electrodeposition of Carbon Films from Various Organic Liquids," Surface & Coatings Technology 124, 2000, pp. 196-200.

Hernadi, K., "Reactivity of Different Kinds of Carbon During Oxidative Purification of Catalytically Prepared Carbon Nanotubes,", Solid State Ionics 141-142, 2001, pp. 203-209.

Colomer, J. F., "Different Purification Methods of Carbon Nanotubes Produced by Catalytic Synthesis," Synthetic Metals 103, 1999, pp. 2482-2483.

Dalton, A.B., "A Functional Conjugated Polymer to Process, Purify and Selectively Interact with Single Wall Carbon Nanotubes," Synthetic Metals 121, 2001, pp. 1217-1218.

Tat, Kerk Wai, "Preparation and Characterization of Cobalt/Silica Core-Shell Magnetic Nanoparticles," Dept. Chem., National University of Singapore 2000/2001, pp. 1-5.

Shipley, Microposit® XP-90104A E-Beam Resist, Preliminary Product Information, pp. 1-2.

Smalley, R. E., Foreword (Publication unknown), Jan. 2001.

Dresselhaus, Mildred S., Preface (Publication unknown) Jan. 2001.

Advanced Semiconductor Engineering, Inc., Substrate Design 420L BGA 35*35, Dwg. No. K-I-10420, 2 pages.

Integrated Device Technology, Inc., DA Package Design, Sep. 25, 1997, 2 pages.

Integrated Device Technology, Inc. BG Package Outline, Feb. 18, 1994.

Pimenta, M.A., "Diameter dependence of the Raman D-band in isolated single-wall carbon nanotubes," Physical Review B, vol. 64, pp. 04140-1-04140-4.

Duan, Xiangfeng, Nonvolatile Memory and Programmable Logic from Molecule-Gated Nanowires, Nano Letters, Mar. 2002, pp. 1-4.

Introduction and Historical Perspective, Chapter 1, pp. 1-48.

Modern CMOS Technology, Chapter 2, pp. 49-92.

Crystal Growth, Wafer Fabrication and Basic Properties of Silicon Wafers, Chapter 3, pp. 93-149.

Kong, J., et al., "Chemical Vapor Disposition of Methane for Single-Walled Carbon Nanotubes," Chemical Physics Letters, 292, 567, 1998.

Li., Y., et al., "Growth of Single-Walled Carbon Nanotubes from Discrete Catalytic Nanoparticles of Various Sizes." *The Journal of Physical Chemistry B* (2001); 105, 11424.

Dai, Hongjie, "Controlled Chemical Routes to Nanotube Architectures, Physics, and Devices." *The Journal of Physical Chemistry B* (1999); 103: 11246-11255.

Li, Y. et al., "Preparation of Monodispersed Fe-Mo Nanoparticles as the Catalyst for CVD Synthesis of Carbon Nanotubes." Chem. Mater., 12, 1008, 2001.

Cassell, A., et al., "Directed Growth of Free-Standing Single-Walled Carbon Nanotubes." *Journal of the American Chemical Society* (1999); vol. 121, 7975-7976.

Delzeit, L., et al., "Multilayered Metal Catalysts for Controlling the Density of Single-walled Carbon Nanotube Growth." Chemical Physics Letters, 348, 368, 2001.

Wei, Y., et al., "Effect of Catalyst Film Thickness on Carbon Nanotube Growth by Selective Area Chemical Vapor Deposition." *Applied Physics Letters* (2001); vol. 78, pp. 1394-1396.

Su., M., et al., "A Scalable CVD Method for the Synthesis of Single-Walled Carbon Nanotubes with High Catalyst Productivity." *Chemical Physics Letters* (2000); vol. 322, 231-326.

Harutyunyan, A., et al., "CVD Synthesis of Single Wall Carbon Nanotubes under 'Soft' Conditions." *Nano Letters* vol. 2c no 5 525 (2002); Published on web Mar. 27, 2002.

Li, Q., et al., "High-Density Growth of Single-Wall Carbon Nanotubes on Silicon by Fabrication of Nanosized Catalyst Thin Films." *Chem. Mater.* (2002), 14, 4262; Published on web Sep. 11, 2002.

Chen, B., et al., "Heterogeneous Single-Walled Carbon Nanotube Catalyst Discovery and Optimization." *Chem. Mater.* (2002); vol. 14 1891-1896.

Yenilmez, E., et al., "Wafer Scale Production of carbon Nanotube Scanning Probe Tips for Atomic Force Microscopy." *Applied Physics Letters*. (2002); vol. 80 No. 12, 2225-2227.

Collins, P., et al., "Engineering Carbon Nanotubes and Nanotube Circuits Using Electrical Breakdown." Science (2001); 292: 706-709.

Kim, W., et al., "Synthesis of Ultralong and High Percentage of Semiconduction Single-walled Carbon Nanotubes." *Nano Letters* (2002); vol. 2 No. 7 703-708. Published on web Jun. 1, 2002.

Liu, et al., "Organizing Single-Walled Carbon Nanotubes on Gold Using a Wet Chemical Self-Assembling Technique, Langmuir," Apr. 18, 2000, vol. 16, No. 8, 3659-3573.

Zheng et al, "Chemical Vapor Deposition Growth of Well-Aligned Carbon Nanotube Patterns on Cubic Mesoporous Silica Films by Soft Lithography", Chemistry of Materials, Jun. 9, 2001, vol. 13, 2240-2242.

Huang, et al., "Patterned Growth of Well-Aligned Carbon Nanotubes: A Soft-Lithographic Approach", The Journal of Physical Chemistry B., Mar. 16, 2000, vol. 104, No. 10, 2193-2196.

Chattopadhyay, et al., "Metal-Assisted Organization of Shortened Carbon Nanotubes in Monolayer and Mulilayer Forest Assemblies", Journal of the American Chemical Society, Aug. 28, 2001, vol. 123, 9451-9452.

Bonard, J. et al., "Monodisperse Multiwall Carbon Nanotubes Obtained with Ferritin as Catalyst", Nano Letters, 2002, vol. 2, No. 6, 665-667.

Collins, P., "Engineering Carbon Nanotubes and Nanotube Circuits Using Electrical Breakdown", Science, vol. 292, Apr. 27, 2001, pp. 706-709.

Homma, Y., "Single-Walled Carbon Nanotube Growth on Silicon Substrates Using Nanoparticle Catalysts", Jpn. J. Appl. Phys., vol. 41 (2002), pp. L89-L91.

Ramsperger, U., "Fabrication and lateral electronic transport measurements of gold nanowires," Applied Physics Letters, Jan. 1, 2001, vol. 78, pp. 85-87.

Legrand, B., "Silicon nanowires with sub 10 nm lateral dimensions: From atomic force microscope lithography based fabrication to electrical measurements," J. Vac. Sci. Technol., May/Jun. 2002, B 20(3), pp. 862-870.

Calleja, M., "Fabrication of gold nanowires on insulating substrates by field-induced mass transport," Applied Physics Letters, Oct. 8, 2001, vol. 79, pp. 2472-2473.

Sax, Herald, "Polysilicon Overfill Etch Back Using Wet Chemical Spin-process Technology," (7 pages).

Snow, E.S. et al." Chemical Detectin with a Single-Walled Carbon Nanotube Capacitor", Science, Mar. 25, 2005, pp. 1942-1945, vol. 307.

Snow, E.S. et al., "Chemical Detection Using Single-Walled Carbon Nanotubes", Naval Research Laboratory, Washington, DC 20375, pp. 376-379.

Bradley, K. et al., "Flexible Nanotube Electronics," *Nano Letters*, vol. 3, No. 10, pp. 1353-1355, 2003.

Casavant, M.J. et al, "Neat macroscopic membranes of aligned carbon nanotubes," *Journal of Appl. Phys.*, Feb. 15, 2003, vol. 93, No. 4, pp. 2153-2156.

Choi, W.B. et al, "Carbon-nanotube-based nonvolatile memory with oxide-nitride-oxide film and nanoscale channel," *Appl. Phys. Lett.*, Jan. 13, 2003, vol. 82, No. 2, pp. 275-277.

Cui, J.B. et al, "Carbon Nanotube Memory Devices of High Charge Storage Stability," *Appl. Phys. Lett.*, Oct. 21, 2002, vol. 81, No. 17, pp. 3260-3262.

Dequesnes, M. et al, "Simulation of carbon nanotube-based nanoelectromechanical switches," *Computational Nanoscience and Nanotechnology*, 2002, pp. 383-386.

Desai et al., "Freestanding Carbon Nanotube Specific Fabrication," Proc. of 2005 5th IEEE Conf., Nanotech., Nagoya, Japan, pp. 1-4, Jul. 2005.

Farajian, A. A. et al, "Electronic transport through bent carbon nanotubes: Nanoelectromechanical sensors and switches," *Phys. Rev. B*, 2003, vol. 67, pp. 205423-1-205423-6.

Calleja, M., "Fabrication of gold nanowires on insulating substrates by field-induced mass transport," Applied Physics Letters, Oct. 8, 2001, vol. 79, pp. 2471-2473.

Sax, Herald, "Polysilicon Overfill Etch Back Using Wet Chemical Spin-process Technology," (7 pages).

Banerjee, et al S. Wong. "Functionalization of Carbon Nanotubes with a Metal-Containing Molecular Complex." Nano Letters (2001); 0, A-E.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bradley, K. et al., "Flexible Nanotube Electronics," Nano Letters, vol. 3, No. 10, pp. 1353-1355, 2003.

Desai et al., "Freestanding Carbon Nanotube Specific Fabrication," Proc. of 2005 5th IEEE Conf., Nanotech., Nagoya, Japan, pp. 1-4, Jul. 2005.

Franklin, N. R. et al, "An Enhanced CVD Approach to Extensive Nanotube Networks with Directionality", Advanced Materials, pp. 890-894, 2002.

Haddon, R. C. "Purification and Separation of Carbon Nanotubes," MRS Bulletin (Apr. 2004) pp. 252-256.

Hafner, Jason H. et al. "Catalytic growth of single-wall carbon nanotubes from metal particles," Chemical Physics Letters, vol. 296, pp. 195-202, Oct. 30, 1998.

Homma, Y., "Single-Walled Carbon Nanotube Growth on Silicon Substrates Using Nanoparticle Catalysts", Jpn. J. Appl. Phys., vol. 41, pp. L89-L91, 2002.

Joselevich, Emesto, "Vectorial Growth of Metallic and Semiconducting Single-Wall Carbon Nanotubes, " Nano Letters, xxxx, vol. 0, pp. A-E.

Kaneto, K., et al., "Electrical conductivities of multi-wall carbon nano tubes", Synthetic Metals, Elsevier Science S.A., vol. 103, pp. 2543-2546, 1999.

Kong, J. et al., "Nanotube Molecular Wires as Chemical Sensors", Science, vol. 287, pp. 622-625, Jan. 28, 2000.

Li, J. et al., "Carbon Nanotube Nanoelectrode Array for Ultrasensitive DNA Detection", Nano Letters, vol. 3, No. 5, pp. 597-602, 2003.

Parikh, K. et al., "Flexible vapour sensors using single walled carbon nanotubes", Sensors and Actuators B, vol. 113, pp. 55-63, 2006.

Peigney, A. et al., "A Study of the Formation of Single- and Double-Walled Carbon Nanotubes by a CVD Method", Journal of Physical Chemistry B, vol. 105, pp. 9699-9710, 2001.

Qi, P. et al., "Toward Large Arrays of Multiplex Functionalized Carbon Nanotube Sensors for Highly Sensitive and Selective Molecular Detection", Nano Letters, vol. 3, No. 3, pp. 347-351, 2003.

Sotiropoulou, S. et al., "Carbon nanotube array-based biosensor", Anal Bioanal Chem, vol. 375, pp. 103-105, 2003.

Stadermann, M. et al., "Nanoscale study of conduction through carbon nanotube networks," Phys. Rev. B 69, 201402(R), 2004.

Valentini, L. et al., "Sensors for sub-ppm $NO_2$ gas detection based on carbon nanotube thin films", Applied Physics Letters, vol. 82, No. 6, pp. 961-963, Feb. 10, 2003.

Fischer, J.E. et al, "Magnetically aligned single wall carbon nanotube films: Preferred orientation and anisotropic transport properties," Journal of Appl. Phys., Feb. 15, 2003, vol. 93, No. 4, pp. 2157-2163.

Kaneto, K. et al., "Electrical conductivities of multi-wall carbon nano tubes," Synthetic Metals, Elsevier Science S.A. (1999), vol. 103, pp. 2543-2546.

Kinaret, J. M. et al,, "A carbon-nanotube-based nanorelay," Applied Physics Letters, Feb. 24, 2003, vol. 82, No. 8, pp. 1287-1289.

Lee, K.H. et al, "Control of growth orientation for carbon nanotubes," Appl. Phys. Lett., Jan. 20, 2003, vol. 82, No. 3, pp. 448-450.

Martel, R., et al, "Carbon Nanotube Field-Effect Transistors and Logic Circuits," DAC 2002, Jun. 10-12, 2002, vol. 7.4, pp. 94-98.

Onoa, G.B., et al., "Bulk production of singly dispersed carbon nanotubes with prescribed lengths," Nanotechnology, vol. 16, pp. 2799-2803, 2005.

Sreekumar, T.V. et al, "Single-wall Carbon Nanotube Films," Chem. Mater., 2003, vol., 15, pp. 175-178.

Stadermann, M. et al., "Nanoscale study of conduction through carbon nanotube networks," Phys. Rev. B 69, 201402(R), 2004.

Tenne, Richard and Alex K. Zettl. "Nanotubes from inorganic Materials," Topics in Applied Physics (2001); 80, 81-112.

Tour, J.M. et al, "NanoCell Electronic Memories," J. Am. Chem. Soc., 2003, vol. 125, pp. 13279-13283.

Verissimo-Alves, M. et al, "Electromechanical effects in carbon nanotubes: Ab initio and analytical tight-binding calculations," Phys. Rev. B., 2003, vol. 67, pp. 161401-1-161401-4.

Yao, B. D. and N. Wang. "Carbon Nanotube Arrays Prepared by MWCVD," Journal of Physical Chemistry (2001); 105, 11395-11398.

Zhan, W. et al, "Microelectrochemical Logic Circuits," J. Am. Chem. Soc., 2003, vol. 125, pp. 9934-9935.

Zhao, Y.-P. et al. "Frequency-dependent electrical transport in carbon nanotubes," Physical Review B (2001); 64, 201402(4).

* cited by examiner

NANOTUBE FILMS AND ARTICLES

CROSS-REFERENCE TO RELATED APPLICATIONS

This application is a divisional of U.S. patent application Ser. No. 10/128,118, filed on Apr. 23, 2002, now U.S. Pat. No. 6,706,402, entitled NANOTUBE FILMS AND ARTICLES which is a continuation-in-part and claims priority under 35 U.S.C. § 120 to the following applications, and all of which are incorporated herein by reference in their entirety:

U.S. patent application Ser. No. 09/915,093, filed Jul. 25, 2001, entitled ELECTROMECHANICAL MEMORY ARRAY USING NANOTUBE RIBBONS AND METHOD FOR MAKING SAME;

U.S. patent application Ser. No. 09/915,095, filed Jul. 25, 2001, now U.S. Pat. No. 6,574,130, entitled HYBRID CIRCUIT HAVING NANOTUBE ELECTROMECHANICAL MEMORY; and U.S. patent application Ser. No. 09/915,173, filed Jul. 25, 2001, now U.S. Pat. No. 6,643,165, entitled ELECTROMECHANICAL MEMORY HAVING CELL SELECTION CIRCUITRY CONSTRUCTED WITH NANOTUBE TECHNOLOGY.

BACKGROUND

1. Technical Field

This invention relates in general to carbon nanotube films, fabrics, layers, and articles and in particular to making electrically conductive articles from carbon nanotube films, fabrics, or layers for a variety of uses in circuits or the like.

2. Discussion of Related Art

The reliable fabrication of electrically conductive, ultra-thin metallic layers and electrodes in the sub-10 nm regime is problematic, see, e.g., S. Wolf, Silicon Processing for the VLSI era; Volume 2—Process Integration (Lattice Press, Sunset Beach, 1990). Metal films in this size regime are usually non-continuous and not conductive over macroscopic distances. Furthermore, these sub-10 nm films are prone to thermal damage by electrical current making them unsuitable for applications such as electrical interconnects in semiconductor devices. Thermal damage of thin metal interconnects caused by their low heat conductivities is one of the main factors inhibiting dramatic miniaturization and performance improvements of highly integrated semiconductor devices.

Conventional interconnect technologies have a tendency to suffer from thermal damage and metal diffusion eroding the performance of the semiconductor devices especially from degradation of the electrical properties. These effects become even more pronounced with size reduction in current generation 0.18 um and 0.13 um structures, e.g. by metal diffusion through ultra-thin gate oxide layers.

There is therefore a need in the art for conductive elements that may operate well in contexts having high current densities or in extreme thermal conditions. This includes circuit contexts with very small feature sizes but includes other high current density extreme thermal environment contexts as well. There is also a need for conductive elements that will be less likely to diffuse undesirable amounts of contaminants into other circuit elements.

SUMMARY

The invention provides nanotube films and articles and methods of making the same. Under one aspect of the invention, a conductive article includes an aggregate of nanotube segments in which the nanotube segments contact other nanotube segments to define a plurality of conductive pathways along the article.

Under other aspects of the invention, the nanotube segments may be single walled carbon nanotubes, or multi-walled carbon nanotubes. The various segments may have different lengths and may include segments having a length shorter than the length of the article.

The articles so formed may be disposed on substrates, and may form an electrical network of nanotubes within the article itself.

Under other aspects of the invention, conductive articles may be made on a substrate by forming a nanotube fabric on the substrate, and defining a pattern within the fabric in which the pattern corresponds to the conductive article.

Under other aspects of the invention, the nanotube fabric is formed by growing the nanotube fabric on the substrate using a catalyst, for example, in which the catalyst is a gas phase catalyst, or in which the catalyst is a metallic gas phase catalyst.

Under other aspects of the invention, the nanotube fabric is formed by depositing a solution of suspended nanotubes on a substrate. The deposited solution may be spun to create a spin-coating of the solution.

Under other aspects of the invention, the solution may be deposited by dipping the substrate into the solution.

Under other aspects of the invention, the nanotube fabric is formed by spraying an aerosol having nanotubes onto a surface of the substrate.

The invention provides a method of making a film of conductive nanotubes. Under one aspect of the invention a substrate is provided and a vapor-phase catalyst is introduced to foster growth of nanotubes. A carbon source is also introduced to grow a layer of nanotubes that are substantially parallel to a major surface of the substrate.

Under another aspect of the invention, the vapor-phase catalyst is a metallocene.

Under another aspect of the invention, conductive articles are made on a substrate, by forming a nanotube fabric on the substrate; defining a pattern within the fabric in which the pattern corresponds to the conductive article; and removing a portion of the fabric so that the patterned fabric remains on the substrate to form conductive articles.

Under another aspect of the invention, conductive articles are made on a substrate, by providing a substrate, introducing a vapor-phase catalyst to foster growth of nanotubes, and introducing a carbon source to grow a layer of nanotubes that are substantially parallel to a major surface of the substrate.

Under another aspect of the invention, conductive articles are made on a substrate, by providing a substrate; providing a patterned layer of material; providing a catalyst that fosters growth of nanotubes; and providing a carbon source, so as to grow nanotubes substantially parallel to a major surface of the substrate in regions defined by the pattern.

Under another aspect of the invention, the patterned layer of material is an insulator or a semiconductor and wherein the nanotubes grow over the patterned material.

Under another aspect of the invention, the patterned layer is a patterned metal layer and wherein the nanotubes grow in areas other than the patterned metal layer.

DETAILED DESCRIPTION

Figure 1:
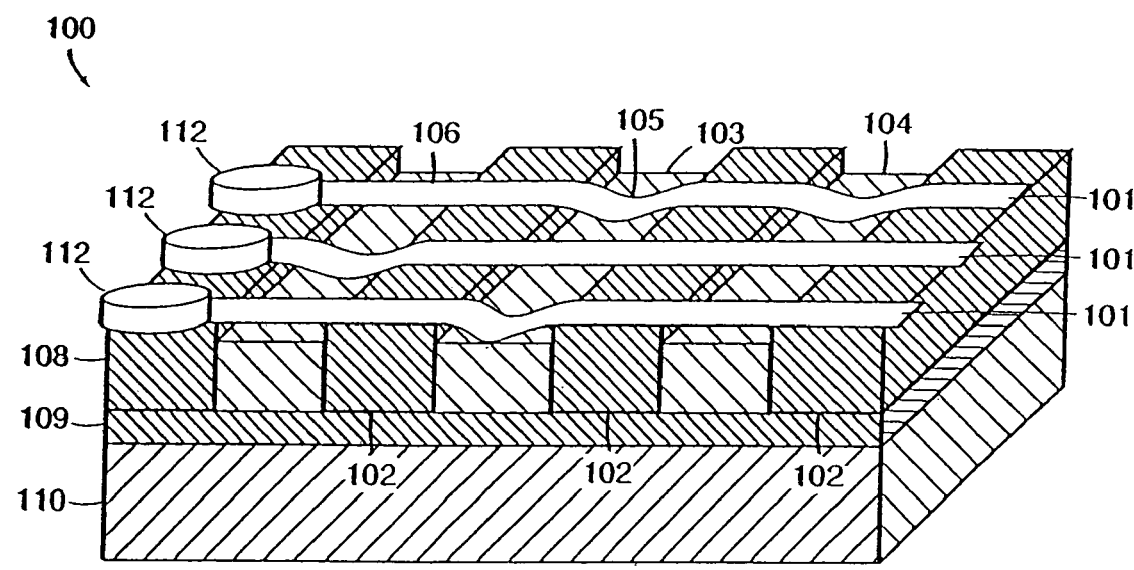
FIG. 1 illustrates a nanotube belt crossbar memory device according to certain embodiments of the invention.

New electromechanical memory arrays and methods for making same are disclosed in which electromechanical memory cells are created that operate analogously to the NTWCM devices disclosed in WO 01/03208, which is hereby incorporated by reference in its entirety. However, unlike the NTWCM devices disclosed in WO 01/03208, new ribbons or belts made from a matted layer of nanotubes or a non-woven fabric of nanotubes are used as an electrically conductive element. At points in this disclosure, the ribbons are referred to as traces or electrically conductive articles. In some instances, the ribbons are suspended, and in other instances they are disposed on a substrate. In some instances, they are used to deflect to certain states under electrical control, and in other instances they do not move and instead are used simply to carry an electrical current or voltage. The new nanotube belt structures are believed to be easier to build at the desired levels of integration and scale (in number of devices made) and the geometries are more easily controlled. The new nanotube ribbons are believed to be able to more easily carry high current densities without suffering the above-outlined problems experienced or expected with metal traces.

Under certain embodiments of the invention, electrically conductive articles may be made from a nanotube fabric, layer, or film. Carbon nanotubes with tube diameters as little as 1 nm are electrical conductors that are able to carry extremely high current densities, see, e.g., Z. Yao, C. L. Kane, C. Dekker, Phys. Rev. Lett. 84, 2941 (2000). They also have the highest known heat conductivity, see, e.g., S. Berber, Y.-K. Kwon, D. Tomanek, Phys. Rev. Lett. 84, 4613 (2000), and are thermally and chemically stable, see, e.g., P. M. Ajayan, T. W. Ebbesen, Rep. Prog. Phys. 60, 1025 (1997). However, using individual nanotubes is problematic because of difficulties in growing them with suitably controlled orientation, length, and the like. Creating traces from nanotube fabrics allows the traces to retain many if not all of the benefits of individual nanotubes. Moreover, traces made from nanotube fabric have benefits not found in individual nanotubes. For example, since the traces are composed of many nanotubes in aggregation, the trace will not fail as the result of a failure or break of an individual nanotube. Instead, there are many alternate paths through which electrons may travel within a given trace. In effect, a trace made from nanotube fabric creates its own electrical network of individual nanotubes within the defined trace, each of which may conduct electrons. Moreover, by using nanotube fabrics, layers, or films, current technology may be used to create such traces.

Nanotube Ribbon Crossbar Memories (NTRCM)

Because the new nanotube belt crossbar memory devices operate analogously to NTWCM, the description of their architecture and principles of operation is brief. Reference may be made to WO 01/03208 for fuller description and background.

FIG. 1 illustrates an exemplary electromechanical memory array 100 constructed according to principles of preferred embodiments of the invention.

The array has a plurality of non-volatile memory cells 103 which can be in an "on" state 105 or "off" state 106. The actual number of such cells is immaterial to understanding the invention but the technology may support devices having information storage capacities equivalent to or larger than modem non-volatile circuit devices.

Each memory cell 103 includes a nanotube ribbon 101 suspended by one or more supports 102 over electrical traces or wires, e.g., 104.

Each crossing of a ribbon 101 and a wire, e.g., 104 forms a crossbar junction and defines a memory cell. Under certain embodiments, each cell may be read or written by applying currents and or voltages to electrodes 112 which are in electrical communication with ribbons 101 or through electrodes (not shown) in communication with traces or wires 104. The supports 102 are made from a layer 108 of silicon nitride (Si3N4). Below layer 108 is a gate oxide layer 109 separating the n-doped silicon traces 104 from an underlying silicon wafer 110.

Figure 2A:
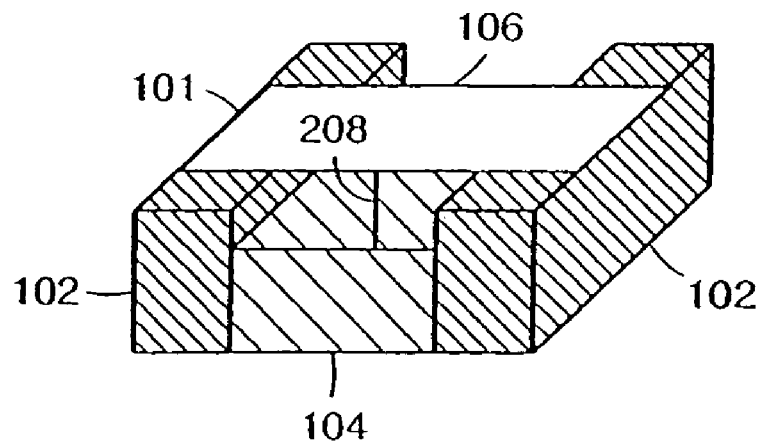
FIGS. 2A–B illustrate two states of a memory cell according to certain embodiments of the invention.
Figure 2B:
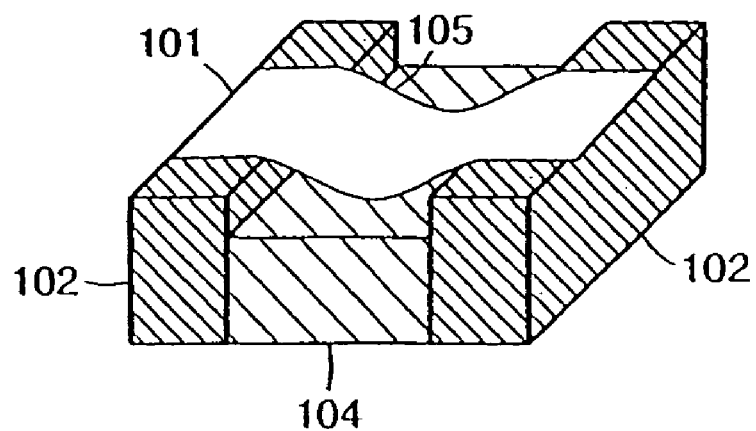

Referring conjointly to FIGS. 1–2B, junction 106 illustrates the cell in a first physical and electrical state in which the nanotube ribbon 101 is separated from corresponding trace 104. Junction 105 illustrates the cell in a second physical and electrical state in which the nanotube ribbon 101 is deflected toward corresponding trace 104. In the first state, the junction is an open circuit, which may be sensed as such on either the ribbon 101 or trace 104 when so addressed. In the second state, the junction is a rectified junction (e.g., Schottky or PN), which may be sensed as such on either the tube 101 or trace 104 when so addressed.

Under certain embodiments, the nanotube ribbon 101 may be held in position at the supports by friction. In other embodiments the ribbon may be held by other means, such as by anchoring the ribbons to the supports using any of a variety of techniques. This friction can be increased through the use of chemical interactions including covalent bonding through the use of carbon compounds such as pyrenes or other chemically reactive species. Evaporated or spin-coated material such as metals, semiconductors or insulators especially silicon, titanium, silicon oxide or polyimide could also be added to increase the pinning strength. The nanotube ribbons or individual nanotubes can also be pinned through the use wafer bonding to the surface. See R. J. Chen et al., "Noncovalent Sidewall Functionalization of Single-Walled Carbon Nanotubes for Protein Immobiliation," J.Am. Chem. Soc., 123, 2001, 3838–39 and Dai et al., Appl. Phys. Lett., 77, 2000, 3015–17 for exemplary techniques for pinning and coating nanotubes by metals. See also WO01/03208 for techniques.

Under certain preferred embodiments as shown in FIGS. 2A–B, a nanotube ribbon 101 has a width of about 180 nm and is pinned to a support 102 preferably fabricated of silicon nitride. The local area of trace 104 under ribbon 101 forms an n-doped silicon electrode and is positioned close to the supports 102 and preferably is no wider than the belt, e.g., 180 nm. The relative separation 208 from the top of the support 102 to the deflected position where the belt 101 attaches to electrode 206 (see FIG. 2B) should be approximately 5–50 nm. The magnitude of the separation 208 is designed to be compatible with electromechanical switching capabilities of the memory device. For this embodiment, the 5–50 nm separation is preferred for certain embodiments utilizing ribbons 101 made from carbon nanotubes, but other separations may be preferable for other materials. This magnitude arises from the interplay between strain energy and adhesion energy of the deflected nanotubes. These feature sizes are suggested in view of modem manufacturing techniques. Other embodiments may be made with much smaller (or larger) sizes to reflect the manufacturing equipment's capabilities.

The nanotube ribbon 101 of certain embodiments is formed from a non-woven fabric of entangled or matted nanotubes (more below). The switching parameters of the ribbon resemble those of individual nanotubes. Thus, the predicted switching times and voltages of the ribbon should approximate the same times and voltages of nanotubes. Unlike the prior art which relies on directed growth or chemical self-assembly of individual nanotubes, preferred embodiments of the present invention utilize fabrication techniques involving thin films and lithography. This method of fabrication lends itself to generation over large surfaces especially wafers of at least six inches. (In contrast, growing individual nanotubes over a distance beyond sub millimeter distances is currently unfeasible.) The ribbons should exhibit improved fault tolerances over individual nanotubes, by providing redundancy of conduction pathways contained with the ribbons. (If an individual nanotube breaks other tubes within the rib provide conductive paths, whereas if a sole nanotube were used the cell would be faulty.) Moreover, the resistances of the ribbons should be significantly lower than that for an individual nanotubes, thus, decreasing its impedance, since the ribbons may be made to have larger cross-sectional areas than individual nanotubes.

Figures 3, 3A:
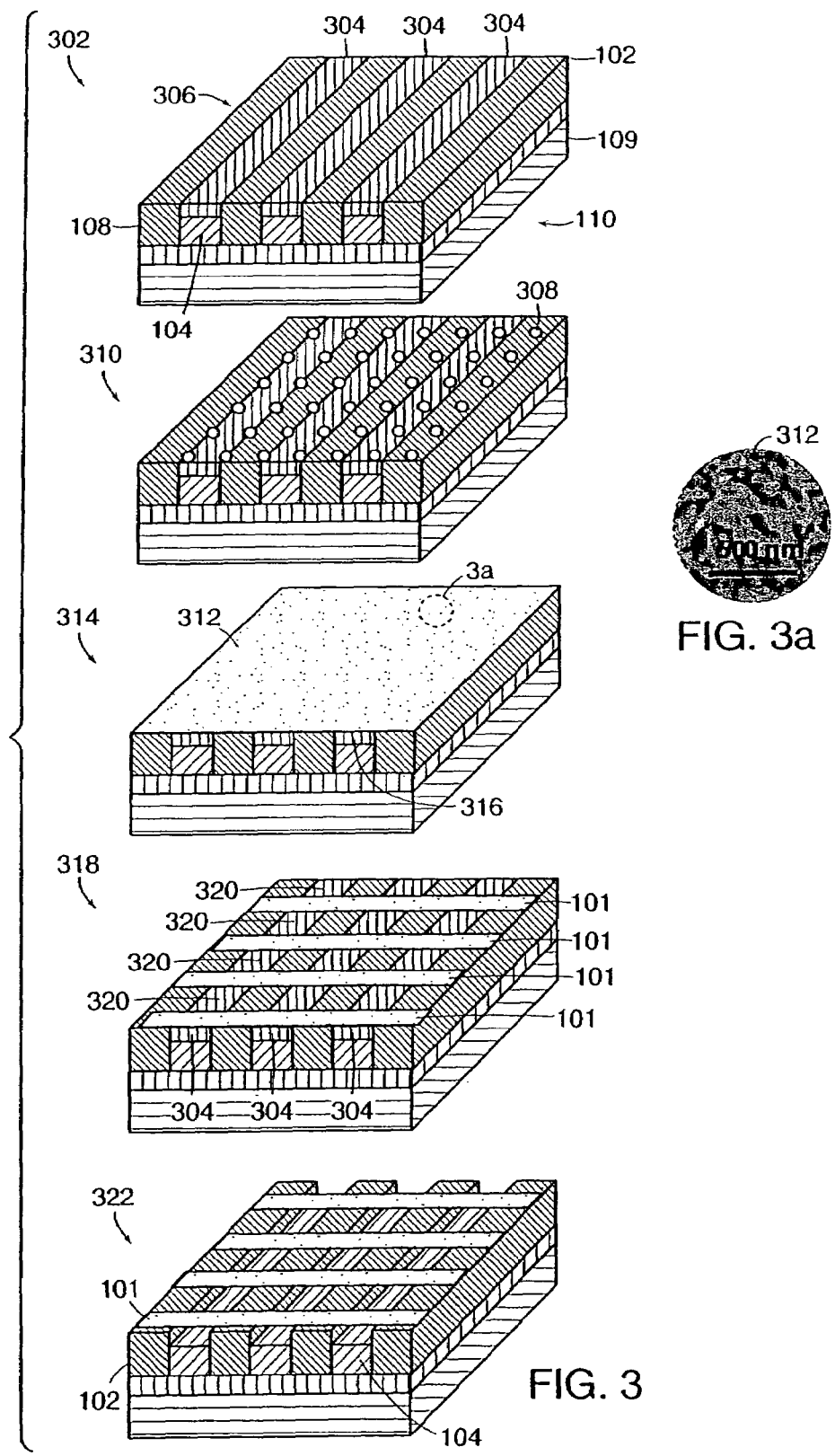
FIG. 3 illustrates acts of making memory devices according to certain embodiments of the invention.

FIG. 3 illustrates a method of making certain embodiments of NTRCM devices 100. A first intermediate structure 302 is created or provided. In the illustrated embodiment, the structure 302 includes a silicon substrate 110 having an insulating layer 109 (such as silicon dioxide) and a silicon nitride layer (Si3N4) 108 that defines a plurality of supports 102. In this instance, the supports 102 are formed by rows of patterned silicon nitride, though many other arrangements are possible, such as a plurality of columns. Conductive traces 104 extend between supports 102. In this instance, the traces 104 are shown as essentially contacting the supports 102, but other arrangements are possible as are other geometries; for example, spaces may exist between trace 104 and support 102 and trace 104 may be fashioned as a wire or may have non-rectangular transverse, cross-sections, including triangular or trapezoidal. Sacrificial layers 304 are disposed above the traces 104 so as to define one planar surface 306 with the upper surface of the supports 102. This planar surface, as will be explained below, facilitates growth of a matted nanotube layer of certain embodiments.

Once such a structure 302 is created or provided, the upper surface 306 receives a catalyst 308. For example, under certain embodiments, a catalyst metal 308, containing iron (Fe), molybdenum (Mo), cobalt or other metals, is applied by spin-coating or other application techniques to create a second intermediate structure 310.

A matted layer 312 of nanotubes is then grown into a non-woven fabric of single-walled carbon nanotubes (SWNTs) to form a third intermediate structure 314. For example, the second intermediate structure 310 may be placed into an oven and heated to a high temperature (for example, about 800–1200° C.) while gases containing a carbon source, hydrogen and inert gas, such as argon or nitrogen, are flowed over the upper surface. This environment facilitates the generation or growth of the matted layer or film 312 of single-walled carbon nanotubes. The layer 312 is primarily one nanotube thick and the various tubes adhere to one another via Van der Waals forces. Occasionally, one nanotube grows over the top of another, though this growth is relatively infrequent due to the growth tendencies of the material. Under some embodiments (not shown), the catalyst 308 may be patterned to assist in growing the nanotubes with specific densities either more or less dense as is desired. When conditions of catalyst composition and density, growth environment, and time are properly controlled, nanotubes can be made to evenly distribute over a given field that is primarily a monolayer of nanotubes. Proper growth requires control of parameters including but not limited to catalyst composition and concentration, functionialization of the underlying surface, spin coating parameters (length and RPM), growth time, temperature and gas concentrations.

A photoresist may then be applied to the layer 312 and patterned to define ribbons in the matted layer of nanotubes 312. The ribbon patterns cross (for example, perpendicularly) the underlying traces 104. The photoresist is removed to leave ribbons 101 of non-woven nanotube fabric lying on planar surface 306 to form fourth intermediate structure 318.

The fourth intermediate structure 318 has portions 320 of its underlying sacrificial layer 304 exposed as shown. The structure 318 is then treated with an acid, such as HF, to remove the sacrificial layer 304, including the portion under the ribbons 101, thus forming an array 322 of ribbons 101 suspended over traces 104 and supported by supports 102.

Subsequent metalization may be used to form addressing electrodes, e.g., 112 shown in FIG. 1.

One aspect of the above technique is that the various growth, patterning, and etching operations may use conventional techniques, such as lithographic patterning. Currently, this may entail feature sizes (e.g., width of ribbon 101) of about 180 nm to as low as 130 nm, but the physical characteristics of the components are amenable to even smaller feature sizes if manufacturing capabilities permit.

Figure 4:
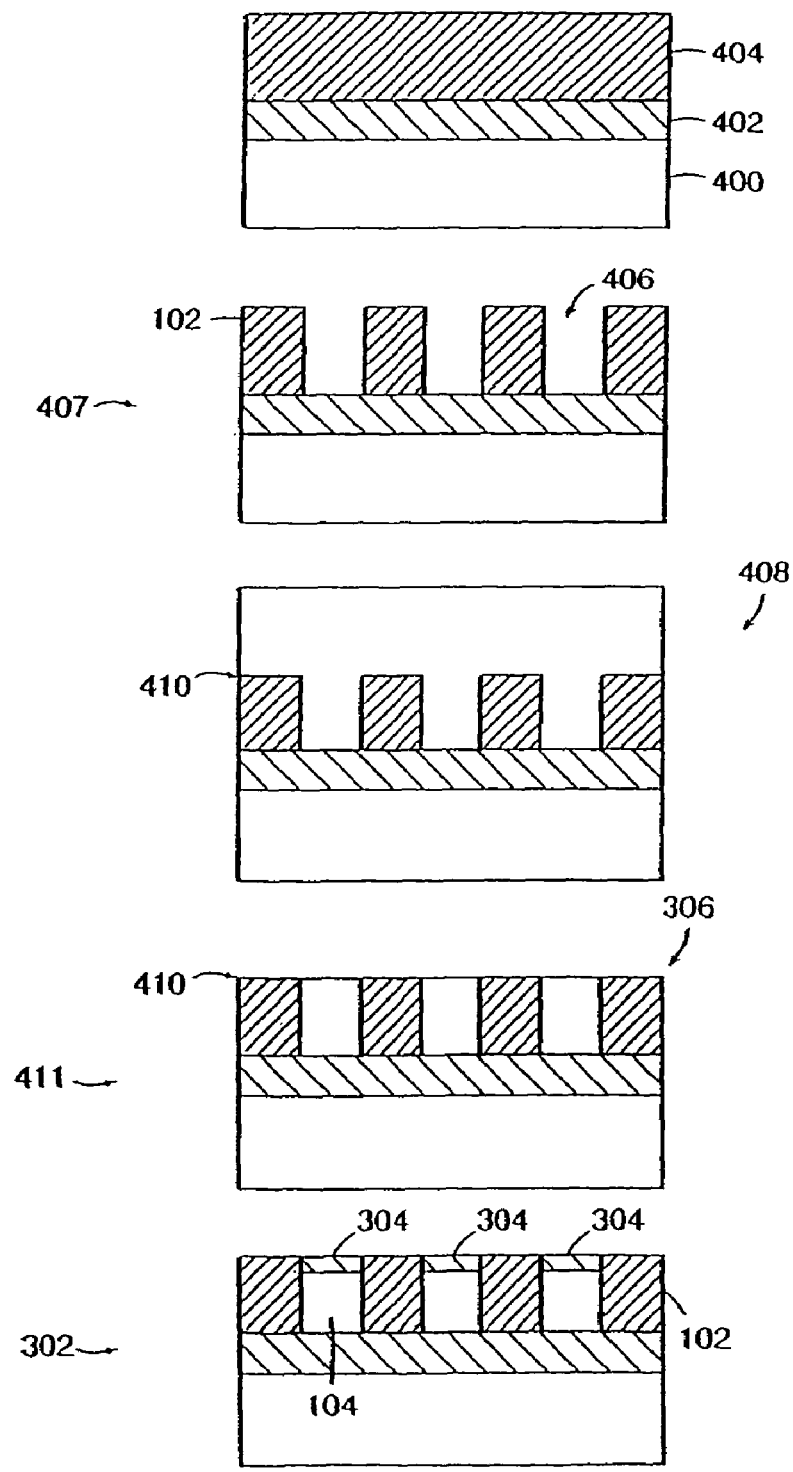
FIGS. 4–11 illustrate several forms of creating an intermediate structure used to make memory devices according to certain embodiments of the invention.

As will be explained below, there are many possible ways of creating the intermediate structures or analogous structures described above. FIG. 4, for example, shows one way to create the first intermediate structure 302

A silicon wafer 400 is provided with an oxide layer 402. The oxide layer is preferably a few nanometers in thickness but could be as much 1 ☐m. A silicon nitride (Si3N4) layer 404 is deposited on top of the oxide surface 402. The silicon nitride layer is preferably at least 30 nm thick.

The silicon nitride layer 404 is then patterned and etched to generate cavities 406 to form support structure 407. With modern techniques the cavity width may be about 180 nm wide or perhaps smaller. The remaining silicon nitride material defines the supports 102 (e.g., as row, or perhaps columns).

A covering 408 of n-doped silicon is then deposited to fill the cavities 406. The covering 408 for exemplary embodiments may be about 1 □m thick but may be as thin as 30 nm.

The covering 408 is then processed, for example by self-flattening of thick silicon layers or by annealing, to produce a planar surface 306, discussed above, to form structure 411. In the case of self-flattening, reactive ion etching (RIE) with end-point detection (EPD) may be utilized until the upper surface 410 of the etched silicon nitride is reached.

The structure 411 is then oxidized to form and define sacrificial layers 304 of SiO2 about 10–20 nm deep into planar surface 306.

The unconverted, remaining portions of silicon form traces 104.

Figure 5:
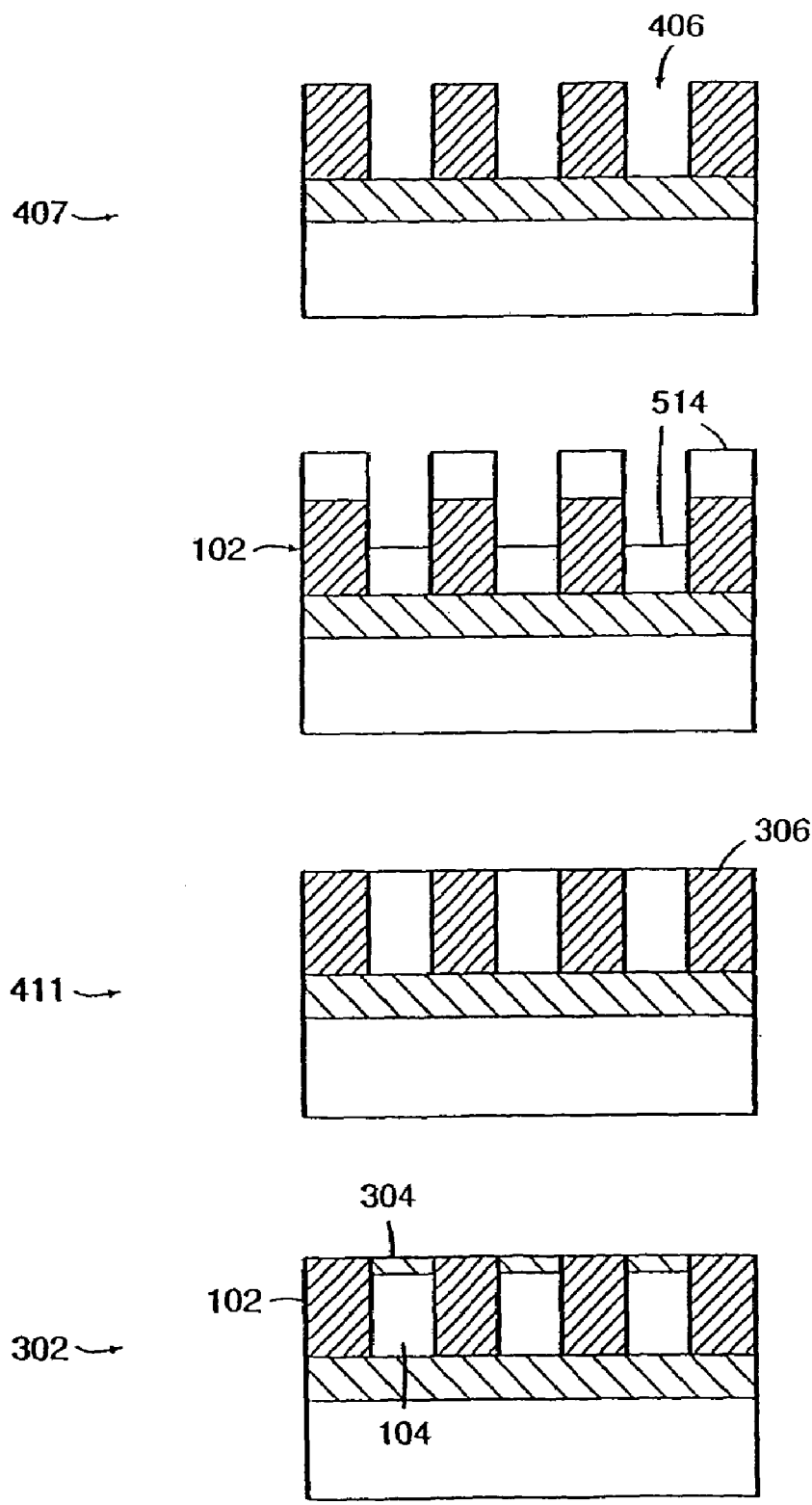

FIG. 5 shows another method that may be used to create the NTRCM devices 100 of certain embodiments. A support structure 407, like that described in connection with FIG. 4, is provided. A layer 514 of n-doped silicon is then added using a CVD process, sputtering or electroplating. Under certain embodiments, layer 514 is added to be about half the height of the Si3N4 supports 102.

After the layer 514 is added, an annealing step is performed to yield a planarized surface 306 to form a structure 411 like that described above. The annealing step causes the silicon of layer 514 to flow into the cavities 406.

Like that described in connection with FIG. 4, the structure 411 is then oxidized to form and define sacrificial layers 304 of SiO2 about 10–20 nm deep into planar surface 306.

Figure 6:
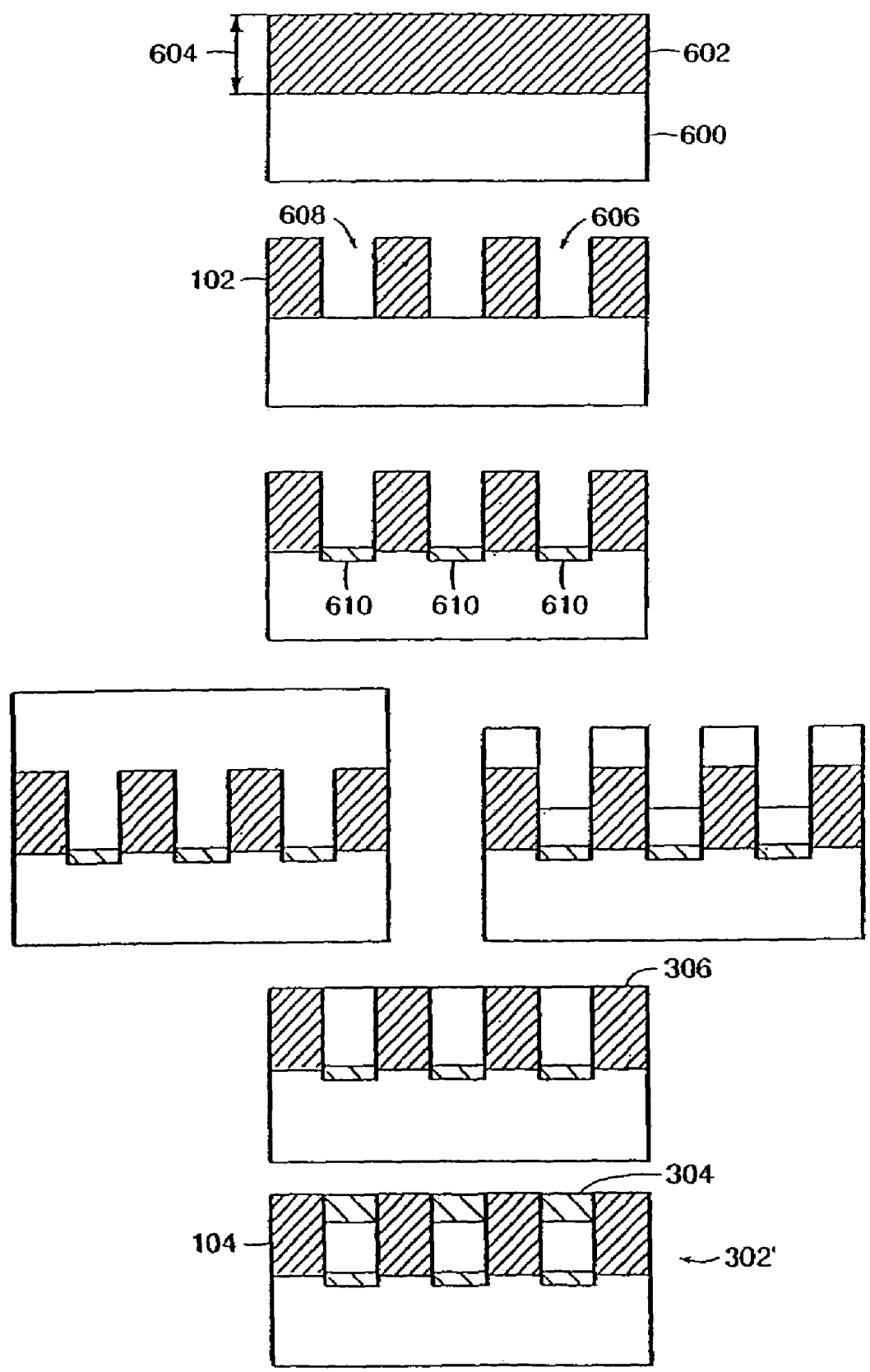

FIG. 6 shows another approach for forming an alternative first intermediate structure 302'. In this embodiment, a silicon substrate 600 is covered with a layer 602 of silicon nitride having a height 604 of at least 30 nm.

The silicon nitride layer 602 is then patterned and etched to generate spacings 606 and to defined supports 102. The etching process exposes a portion 608 of the surface of silicon substrate 600.

The exposed silicon surface 608 is oxidized to generate a silicon dioxide (SiO2) layer 610 having a thickness of a few nm. These layers 610 eventually insulate traces 104 analogously to the way insulating layer 109 did for the above-described structures 302.

Once the insulating layers 610 have been created, the traces 104 may be created in any of a variety of manner. FIG. 6 illustrates the processing steps of figures 4–5 used to create such traces to illustrate this point.

Figure 7:
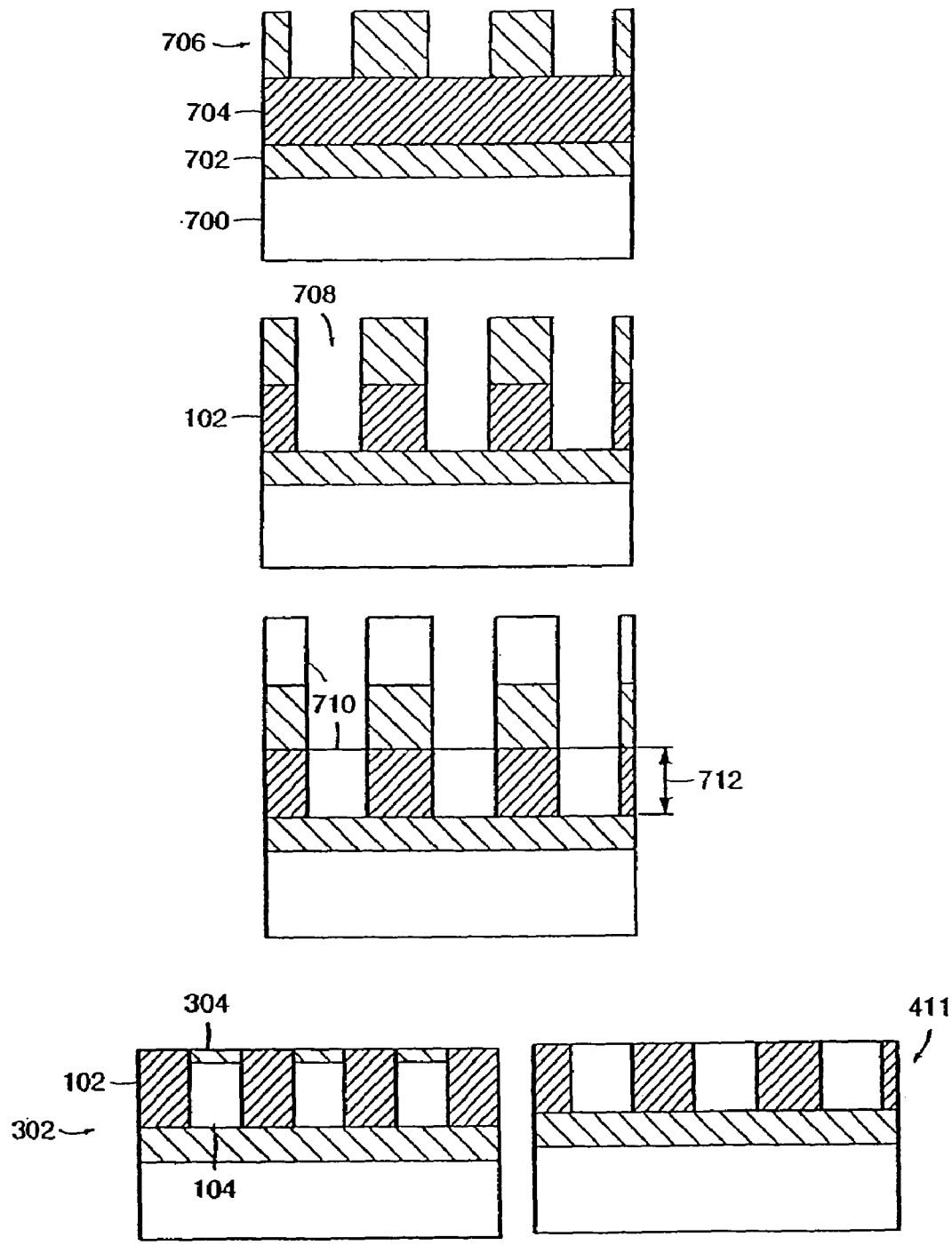

FIG. 7 shows another approach for forming first intermediate structure 302. A silicon substrate 700 having a silicon dioxide layer 702 and a silicon nitride layer 704 receives a patterned photoresist layer 706. For example, a photoresist layer may be spin-coated on layer 704 and subsequently exposed and lithographically developed.

Reactive ion etching (RIE) or the like may then be used to etch the Si3N4 layer 704 to form cavities 708 and to define supports 102.

Afterwards, n-doped silicon 710 may be deposited in the cavities 708. Under certain embodiments silicon is deposited to a height about equal to the height 712 of the Si3N4 supports 102.

The photoresist 706 and silicon 710 on top of the photoresist 706 are then stripped away to form an intermediate structure 411 like that described above.

The structure 411 is then oxidized to generate the sacrificial SiO2 layers 304.

Figure 8:
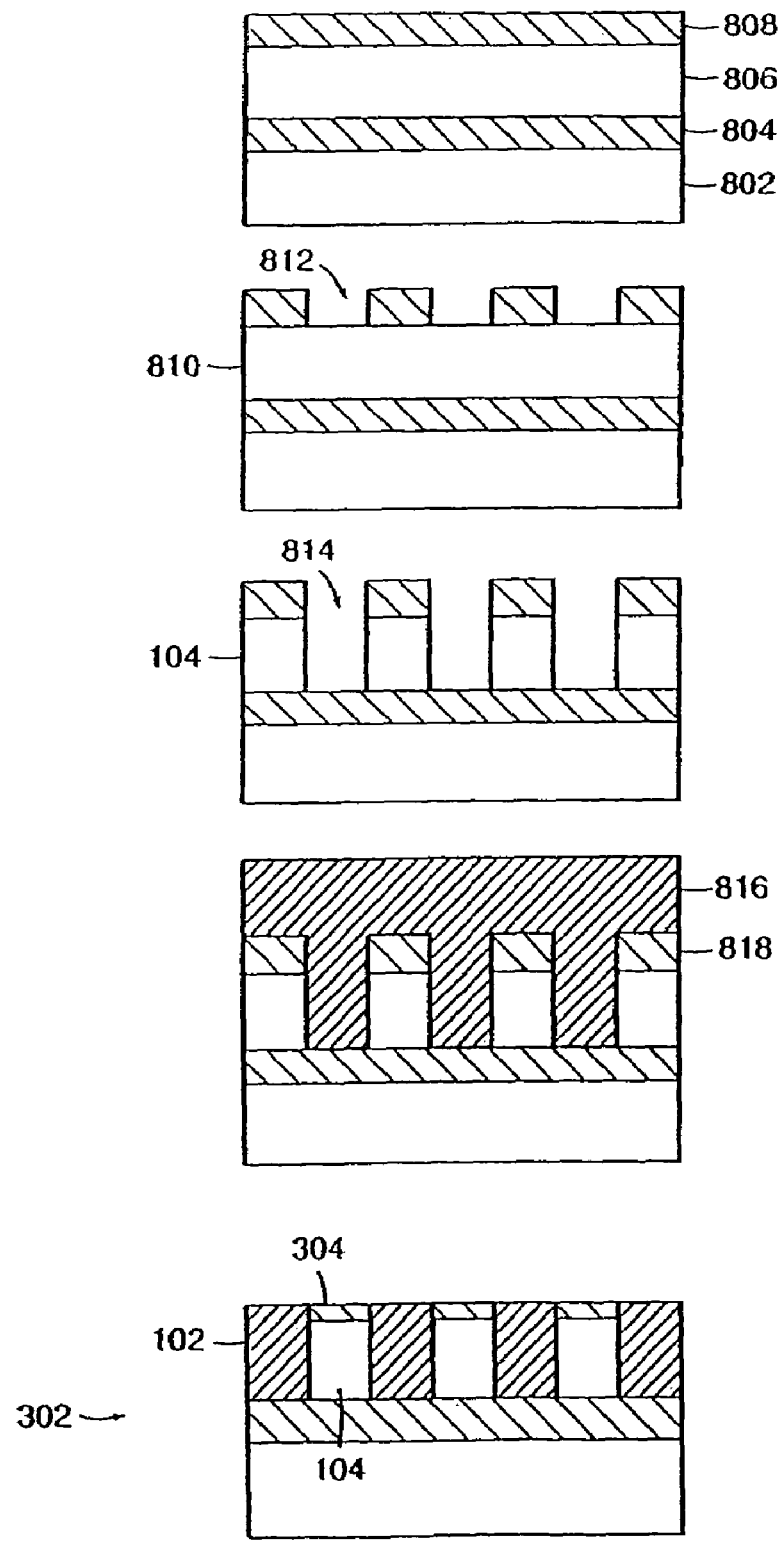

FIG. 8 shows another approach for forming first intermediate structure 302. Under this approach, a starting structure 800 is provided having a lowest silicon layer 802 with a lowest silicon dioxide layer 804 on top of it. A second silicon layer 806 is on top of layer 804 and a second silicon dioxide layer 808 is on top of the second silicon layer 806.

The top silicon dioxide (SiO2) layer 808 is patterned by photolithography to create an RIE mask 810. The mask is used to etch the exposed portions 812 of second silicon layer 806 down to the first silicon dioxide layer 804. This etching creates cavities 814 and defines traces 104.

The cavities 814 are filled and covered with silicon nitride (Si3N4) 816.

The Si3N4 covering 816 is backetched with RIE to the same height 818 as the remaining portions of the SiO2 layer 806 covering the n-doped silicon electrodes 104 (which form the sacrificial layer 304).

Figure 9:
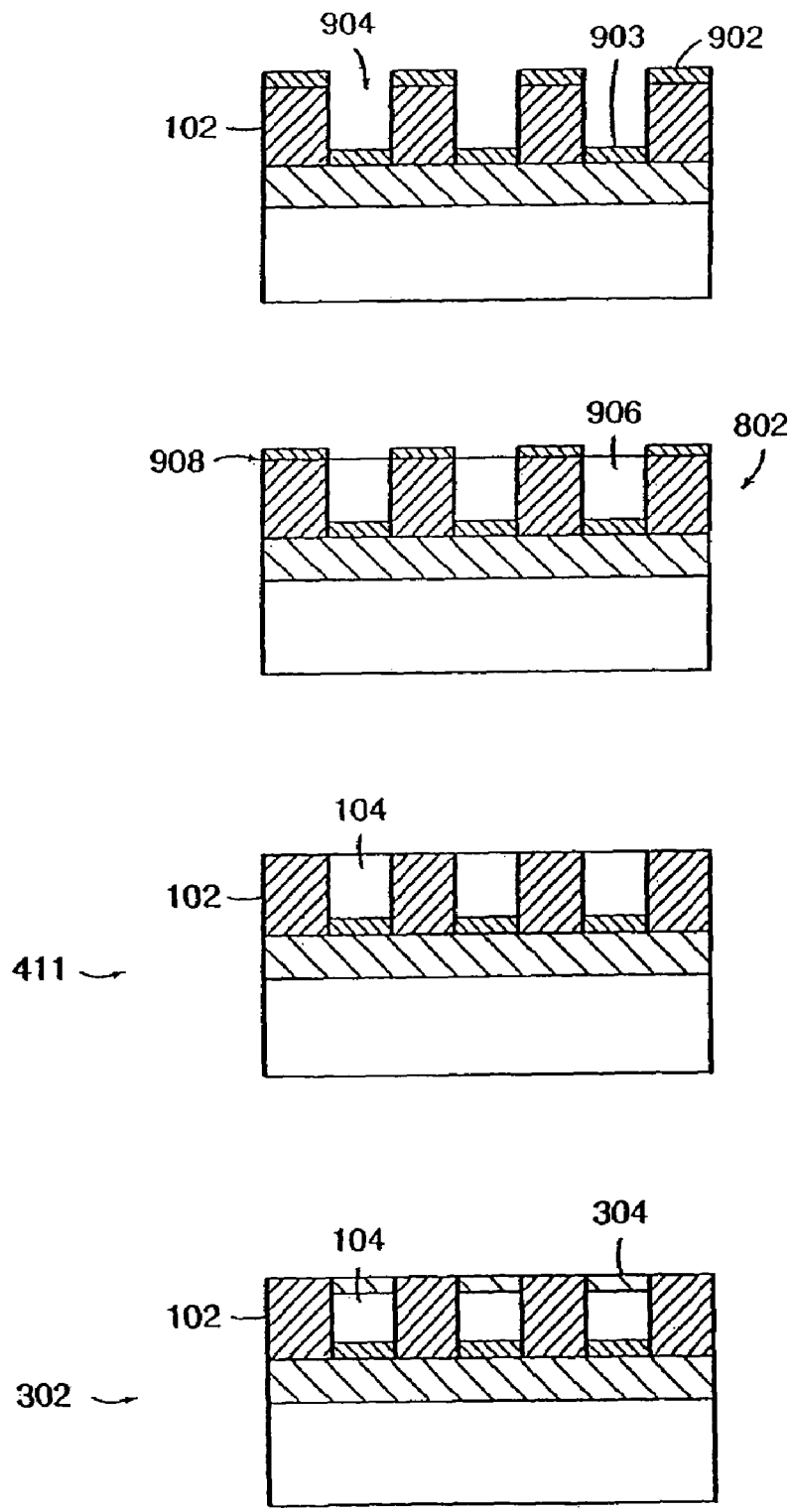

FIG. 9 shows an approach for forming an alternative first intermediate structure 302". Under this approach, a structure like 407 (shown in FIG. 4, but not FIG. 9) is provided. In this instance, the Si3N4 supports 102 have a height of about 30 nm. A thin layer of metal 902 is deposited on top of the Si3N4 supports 102 and on top of the exposed portions SiO2 at the bottom of the cavities 904 as depicted by item 903. Metal 902 and 903 form temporary electrodes. A layer of n-doped silicon 906 may then be deposited or grown by electroplating, covering the electrode 903 until the silicon 906 achieves a height 908 at the top of the support 102 and contacting electrode 902. The growth process may be controlled by the onset of a current flow between the lower and upper metal electrodes 902,3.

The exposed metal electrodes 902 may then be removed by wet chemical methods or dry chemical methods. This forms an intermediate structure 411' like the structure 411 described above, but with a buried electrode 903, as an artifact of the silicon growing process.

The structure 411' is then oxidized to form sacrificial layers 304 at the exposed portions of silicon, as described above. For example, the layers 304 may be grown to a thickness of about 10 nm.

Figure 10:
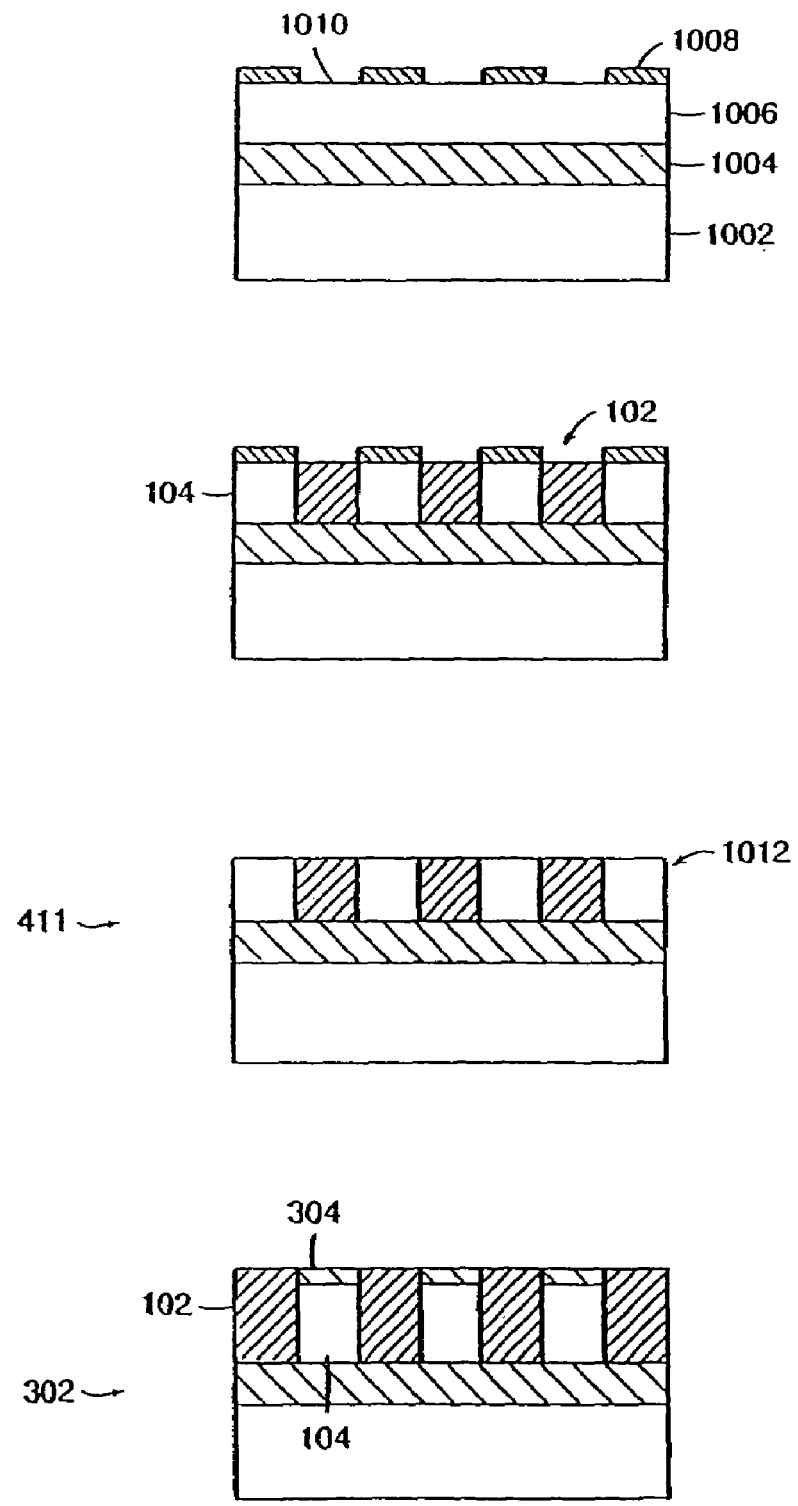

FIG. 10 shows another approach for forming first intermediate structure 302. A silicon substrate 1002 having a layer of silicon dioxide 1004 on top of it and a second layer 1006 of silicon (n-doped) on top of layer 1004 is used as a starting material. A mask layer 1008 is photolithographically patterned on top of layer 1006.

Using nitridization techniques, exposed portions 1010 of n-doped silicon layer 1006 are chemically converted to Si3N4 supports 102. The unconverted portions of layer 1006 form traces 104.

The mask 1008 is removed forming a structure 411 like that described above.

The exposed portions 1012 of silicon surface are then oxidized to form the SiO2 sacrificial layers 304.

Figure 11:
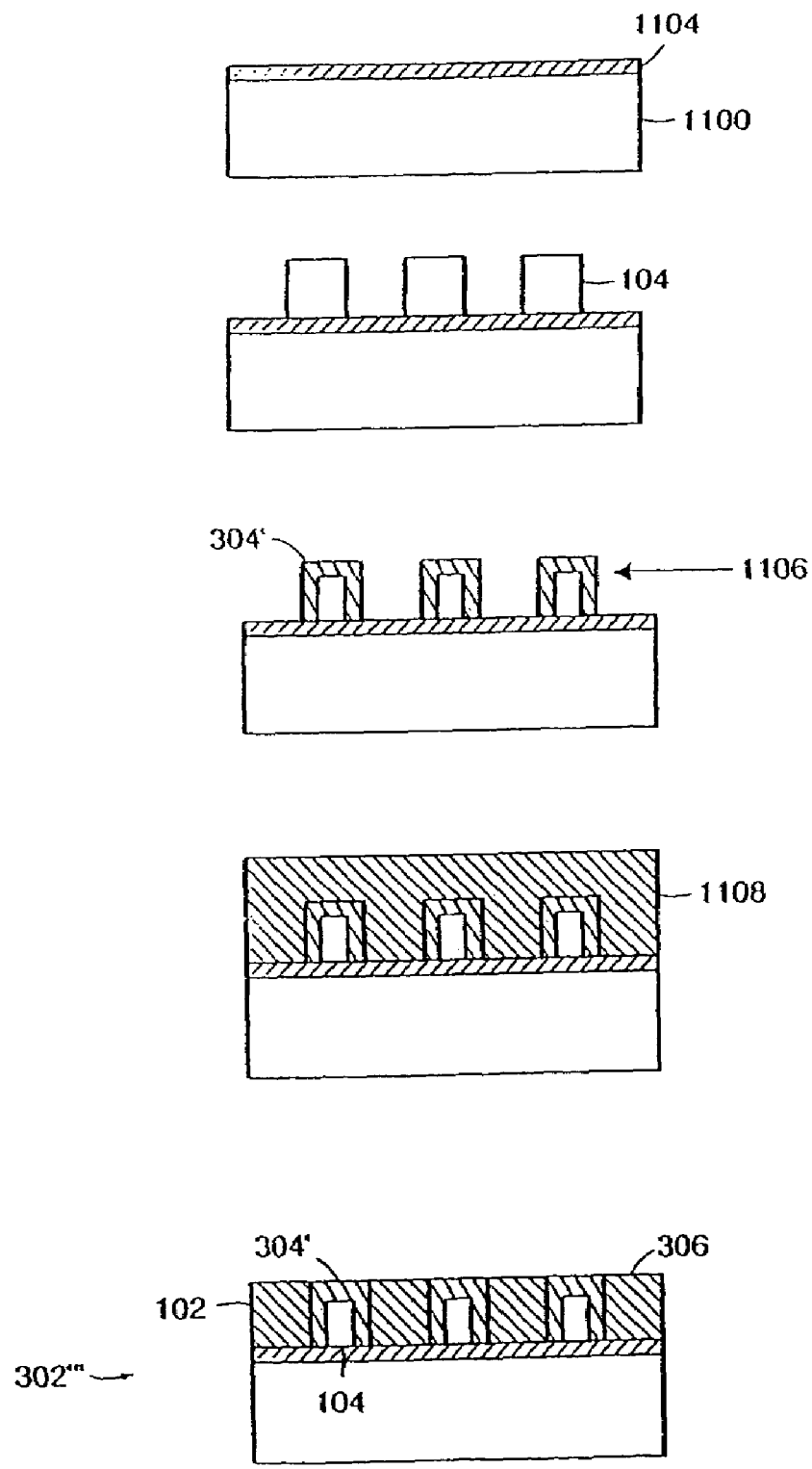

FIG. 11 shows an approach for forming an alternative first intermediate structure 302'''. Under this approach a silicon substrate 1102 is layered with a thin film 1104 of Si3N4 as a starting structure. On top of the silicon nitride layer 1104, n-doped silicon is added and lithographically patterned, by RIE, to form traces 104.

The surfaces of traces 104 are oxidized to form the SiO2 layer 1106 which acts as an alternative form of sacrificial layer 304'.

The structure is overgrown with Si3N4 1108 and back etched to form a planar surface 306 and to form alternative first intermediate structure 302'''. As will be evident to those skilled in the art, under this approach, when the sacrificial layer is subsequently removed, traces 104 will be separated from supports 102. Other variations of this technique may be employed to create alternative transverse cross-sections of trace 104. For example, the traces 104 may be created to have a rounded top, or to have a triangular or trapezoidal cross section. In addition, the cross section may have other forms, such as a triangle with tapered sides.

As was explained above, once a first intermediate structure is formed, e.g., 302, a matted nanotube layer 312 is provided over the planar surface 306 of the structure 302. In preferred embodiments, the non-woven fabric layer 312 is grown over the structure through the use of a catalyst 308 and through the control of a growth environment. Other embodiments may provide the matted nanotube layer 312 separately and apply it directly over the structure 302. Though structure 302 under this approach preferably includes the sacrificial layer to provide a planar surface to receive the independently grown fabric, the sacrificial layer may not be necessary under such an approach.

Figure 12:
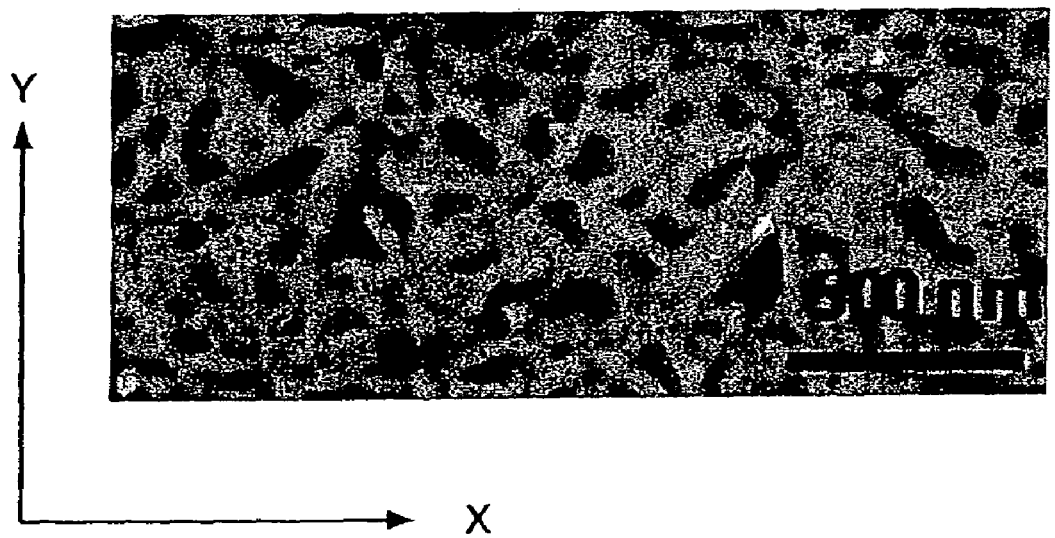
FIG. 12 illustrates the non-woven nanotube fabric, or matted nanotube layer, used to make certain embodiments of the invention.

Because the growth process causes the underside of such nanotubes to be in contact with planar surface 306 of intermediate structure 302, they exhibit a "self-assembly" trait as is suggested by FIG. 12. In particular, individual nanotubes tend to adhere to the surface on which they are grown whenever energetically favorable, such that they form substantially as a "monolayer." Some nanotubes may grow over another so the monolayer is not expected to be perfect. The individual nanotubes do not "weave" with one another but do adhere with one another as a consequence of Van der Waals forces. FIG. 12 is an approximate depiction of an actual nanotube non-woven fabric. Because of the small feature sizes of nanotube, even modern scanning electron microscopy cannot "photograph" an actual fabric without loss of precision; nanotubes have feature sizes as small as 1–2 nm which is below the precision of SEM. FIG. 12 for example, suggests the fabric's matted nature; not clear from the figure, however, is that the fabric may have small areas of discontinuity with no tubes present. Each tube typically has a diameter 1–2 nm (thus defining a fabric layer about 1–2 nm) but may have lengths of a few microns but may be as long as 200 microns. The tubes may curve and occasionally cross one another. Tubes attach to one another via Van der Waals forces.

In certain embodiments, nanotubes grow substantially unrestrained in the x- and y-axis directions, but are substantially restricted in the z-axis (perpendicular to page of FIG. 12) as a consequence of the self-assembly trait. Other embodiments may supplement the above approach to growing matte 312 with the use of field-oriented or flow-oriented growth techniques. Such supplementation may be used to further tailor growth such that any growth in one planar axis (e.g. the -x-axis) is retarded. This allows for a more even coverage of the desired area with a planar interwoven monolayer coating of nanotubes with a controllable density.

Figure 13:
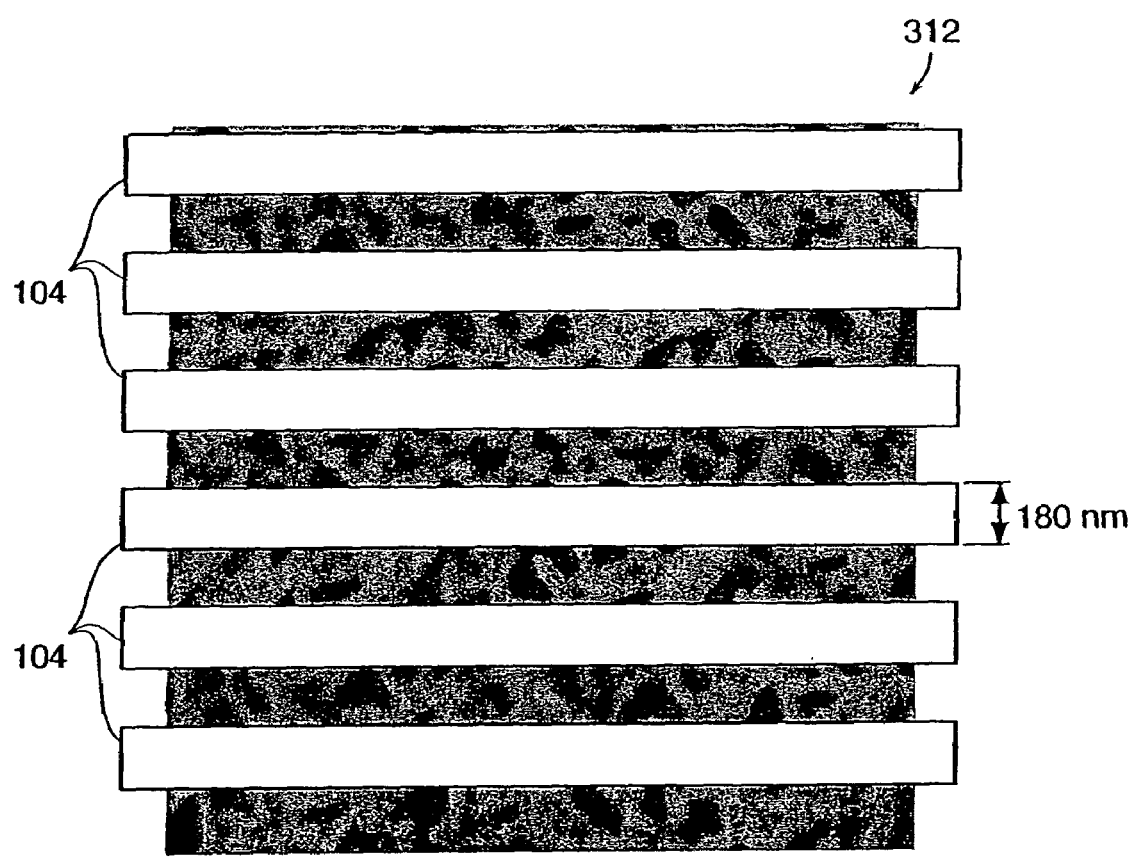
FIG. 13 illustrates the matted nanotube layer in relation to hidden, underlying traces of certain embodiments of the invention.

A plan view of the matted nanotube layer 312 with underlying silicon traces 104 is shown in FIG. 13.

As explained above, once the matted nanotube layer 312 is provided over the surface 306, the layer 312 is patterned and etched to define ribbons 101 of nanotube fabric that cross the supports 102. The sacrificial layer is then removed (e.g., with acid) forming the array 322 described above in connection with FIG. 3. Because the matted layer of nanotubes 312 form a non-woven fabric that is not a contiguous film, etchants or other chemicals may diffuse between the individual nanotube "fibers" and more easily reach the underlying components, such as the sacrificial layer.

Subsequent metalization may be used to form addressing electrodes, e.g., 112 shown in FIG. 1, as outlined above. Other embodiments use nanotube technology to implement addressing of memory cells instead of using metallized electrodes 112 and addressing lines (not shown).

More specifically, under certain embodiments described above, nanotubes are used to form NTRCM arrays. Certain embodiments use nanotube technology, whether in individual wire or belt form, to implement addressing logic to select the memory cell(s) for reading or writing operations. This approach furthers the integration of nanotube technology into system design and may provide beneficial functionality to higher-level system design. For example, under this approach the memory architecture will not only store memory contents in non-volatile manner but will inherently store the last memory address.

The nanotube-based memory cells have bistability characterized by a high ratio of resistance between "0" and "1" states. Switching between these states is accomplished by the application of specific voltages across the nanotube belt or wire and the underlying trace, in which at least one of the memory cell elements is a nanotube or a nanotube ribbon. In one approach, a "readout current" is applied and the voltage across this junction is determined with a "sense amplifier." Reads are non-destructive, meaning that the cell retains its state, and no write-back operations are needed as is done with DRAM.

Figure 14:
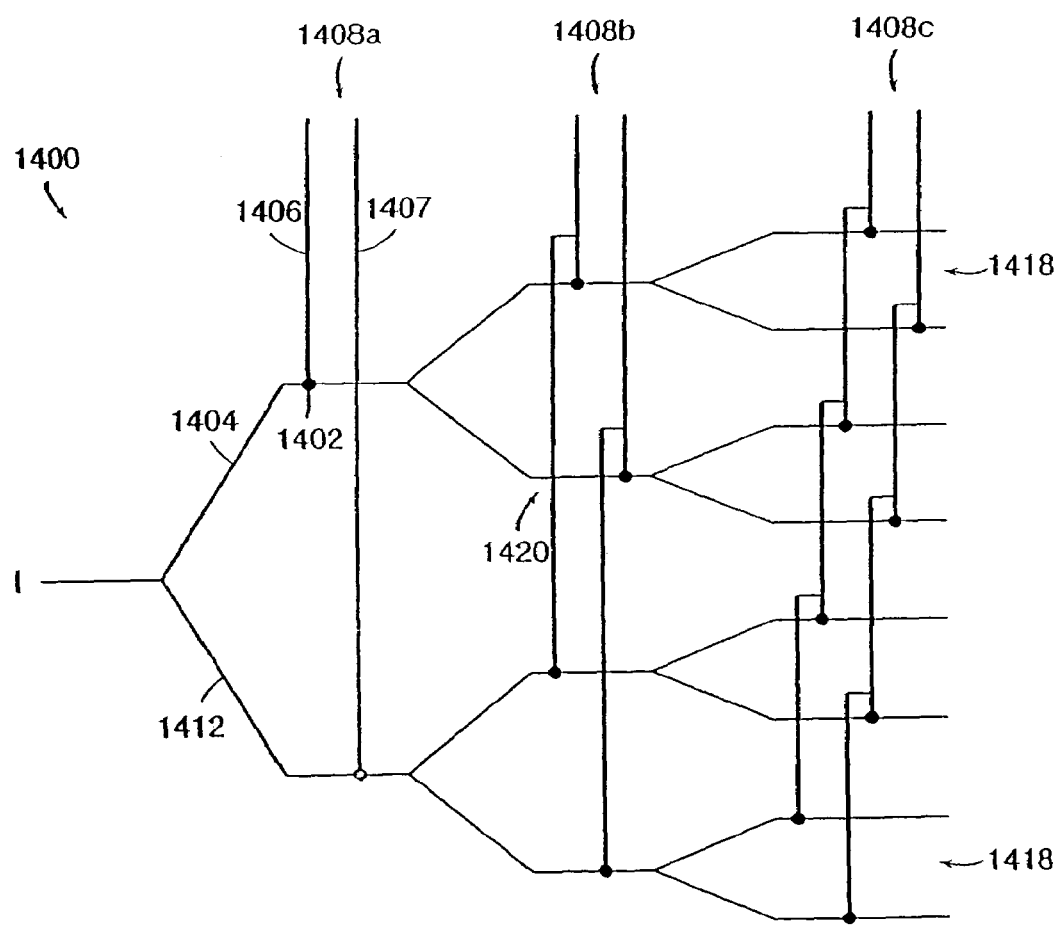
FIG. 14 illustrates addressing logic of certain embodiments of the invention.

FIG. 14 depicts a branching binary select system, or decoder, 1400. As will be explained below, decoder 1400 may be implemented with nanotubes or nanotube ribbon technology. Moreover, the decoder may be constructed on the same circuit component as a nanotube memory cell array, e.g., NTRCM or NTWCM.

A perpendicular intersection of two lines 1404 and 1406 depicted as a dot 1402 indicates a junction of two nanotubes or nanotube ribbons. In this regard, the interaction is analogous to a "pass transistor" found in CMOS and other technology, in which the intersection may be opened or closed.

Locations such as 1420 where one nanotube or nanotube ribbon may cross another but which are not intended to create a crossbar junction may be insulated from one another with a lithographically patterned insulator between the components.

For the sake of clarity, the decoder illustrated is for a 3-bit binary address carried on addressing lines 1408. Depending on the value of the encoding the intersections (dots) will be switched to create only one path through which sensing current I may pass to select lines 1418.

To use this technique, a "dual rail" representation 1408 of each bit of the binary address is fashioned externally so that each of the address bits 1410 is presented in true and complementary form. Thus, line 1406 may be the logical true version of address line 1408a and line 1407 may be the logical complement of address line 1408a. The voltage values of the representation 1408 are consistent with that needed to switch a crossbar junction to the "1" or "0" state as described above.

In this fashion an address 1408 may be used to supply a sense current I to a bit or row of bits in an array, e.g., to nanotubes or nanotube ribbons. Likewise, the same approach may be used to sense a given trace, for example, selecting specific array column(s) to read sense from in conjunction with selecting a row. Thus this approach may be used for X and/or Y decoding both for reading and for writing operations.

Figure 15:
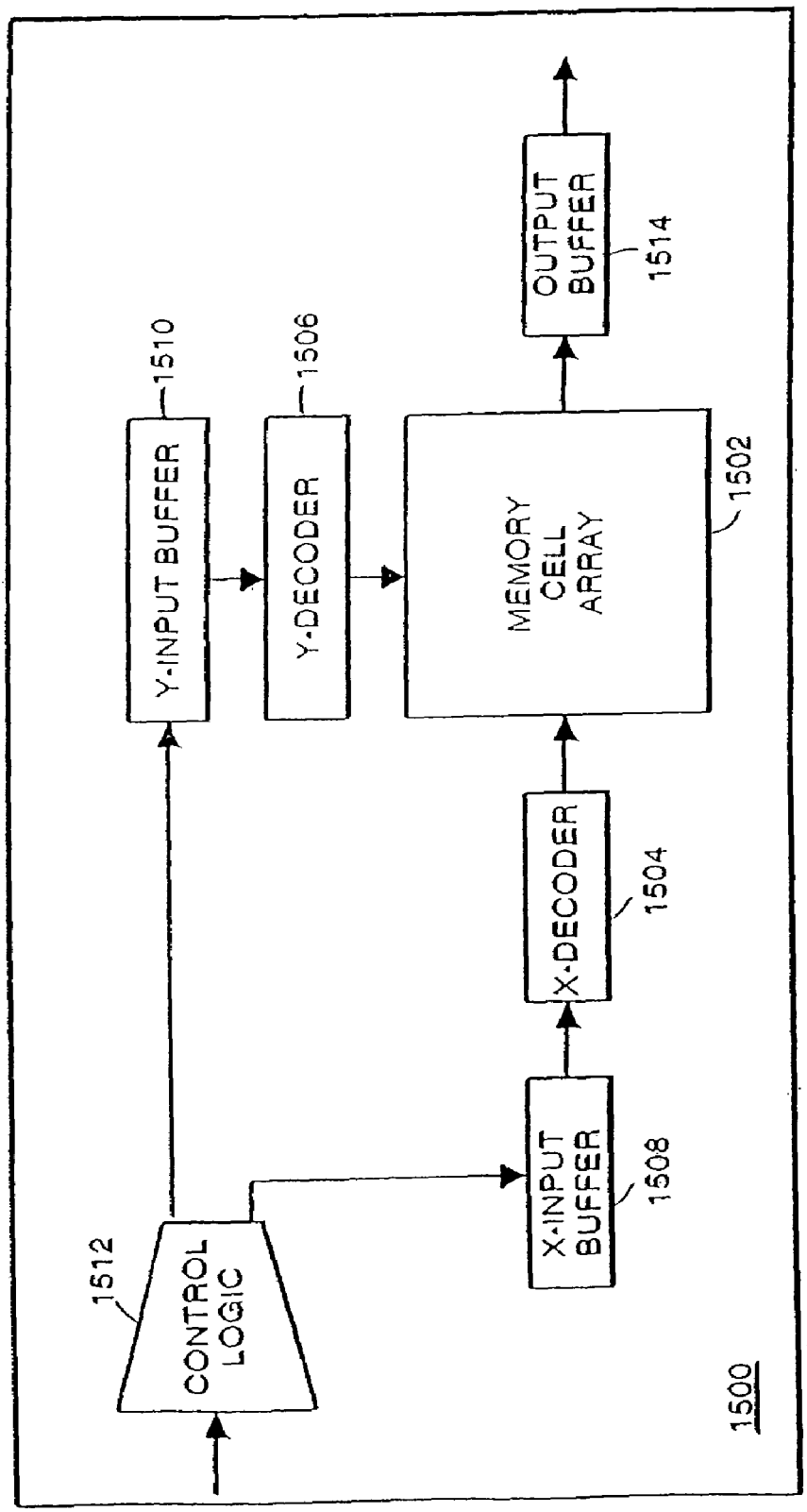
FIG. 15 illustrates a hybrid technology embodiment of the invention in which the memory core uses nanotube technology.

Certain embodiments of the invention provide a hybrid technology circuit 1500, shown in FIG. 15. A core memory cell array 1502 is constructed using NTWCM or NTRCM, and that core is surrounded by semiconductor circuits forming X and Y address decoders 1504 and 1506; X and Y buffers 1508 and 1510; control logic 1512 and output buffers 1514. The circuitry surrounding the NTWCM or NWBCM core may be used for conventional interfacing functions, including providing read currents and sensing output voltages.

In other embodiments, the X and Y address decoders 1504 and 1506 may be substituted with the nanotube wire or belt addressing technique discussed above. In these embodiments the core would include memory cells and addressing logic.

In certain embodiments, the hybrid circuit 1500 may be formed by using a nanotube core (having either just memory cells or memory cells and addressing logic) and by implementing the surrounding circuitry using a field programmable gate array. The core and gate array circuitry may be contained in a single physical package if desired. Or, they may be packaged separately. For example, a hermetically packaged nanotube circuit (having memory or memory and addressing logic) may be combined with a PLD/FPGA/ASIC in which the I/O interfacing logic is contained. The resulting compact chipset provides access to the benefits of the NT memory for the user of the product, while maximizing the use of "off-the-shelf" technologies, which may be utilized on an as-needed basis by the manufacturer.

Figure 16:
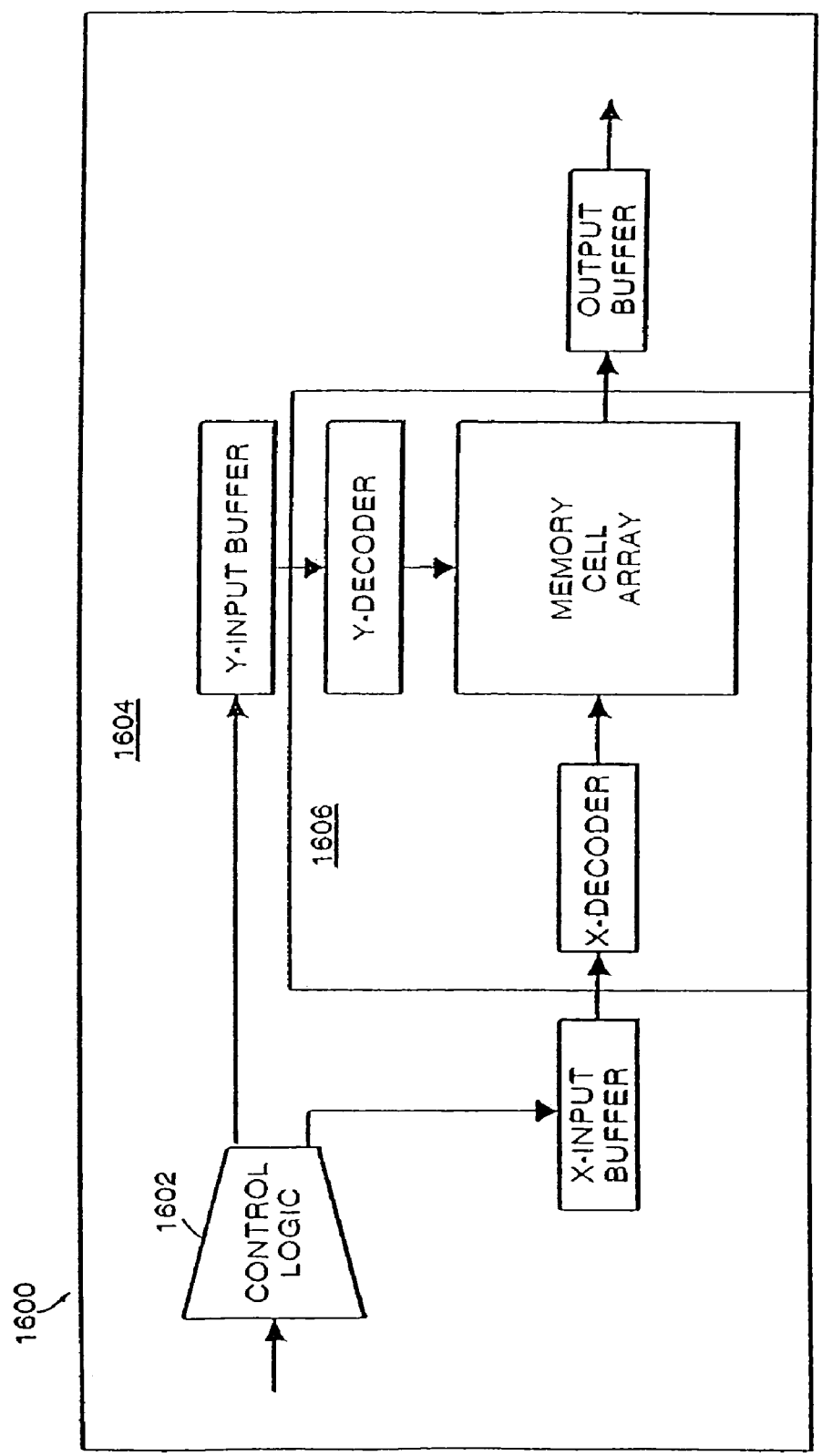
FIG. 16 illustrates a hybrid technology embodiment of the invention in which the memory core and addressing lines use nanotube ribbon technology.

FIG. 16 depicts one possible implementation 1600 of the hybrid technology. A FPGA chip 1602 containing the buffering and control logic (described above) is connected via conducting traces on a (perhaps multilayer) printed circuit board (PCB) 1604 to a nanotube (NT) chip 1606 containing the memory cells and addressing logic.

This particular embodiment is suggested to conform to the PCI bus standard, typical of today's personal computers. Other passive circuitry, such as capacitors, resistors, transformers, etc. (not pictured) would also be necessary to conform to the PCI standard. A front-side bus speed of 200 MHz–400 MHz is annotated, suggesting the kinds of external clock speeds such a chipset might run at. This speed is limited by the PCB interconnects and FPGA/PLD/ASIC speed, and also the chip packages, not the NT memory cell speed.

Carbon Nanotube Films, Layers, Fabrics, and Articles

The above embodiments of NTRCM and addressing lines use traces or electrically conductive articles made from nanotube layers 312, such as those shown in FIGS. 3 and 12. The layers may have thickness of about 1 nm or less, i.e., the thickness of a given nanotube. The nanotube matte 312 is grown or deposited on a surface, such as that of a silicon wafer, to form a contiguous film of a given density. The two dimensional film can then be patterned to generate electrically conductive lines or traces ranging in width from 1 nm (the intrinsic minimum size of a nanotube) to hundreds of microns or greater, depending on the application and context. The pattern can be generated at multiple length and width scales to allow the interconnection of various sized semiconductor devices such as transistors or memory elements and eventually fanning out to bond pads or other interconnecting materials or constructs. The nanotube interconnects can be metallized if necessary to connect different materials because of their intrinsic properties that allow easy contact to metallic or semiconductor materials.

The traces and electrically conductive articles may be used in other forms of circuits. For example, nanotube traces may be used for their ability to withstand high current densities, normally found in very small sized traces (e.g., sub 10 nm regimes). They may also be used to reduce the likelihood of contaminating other circuit features.

Figure 17:
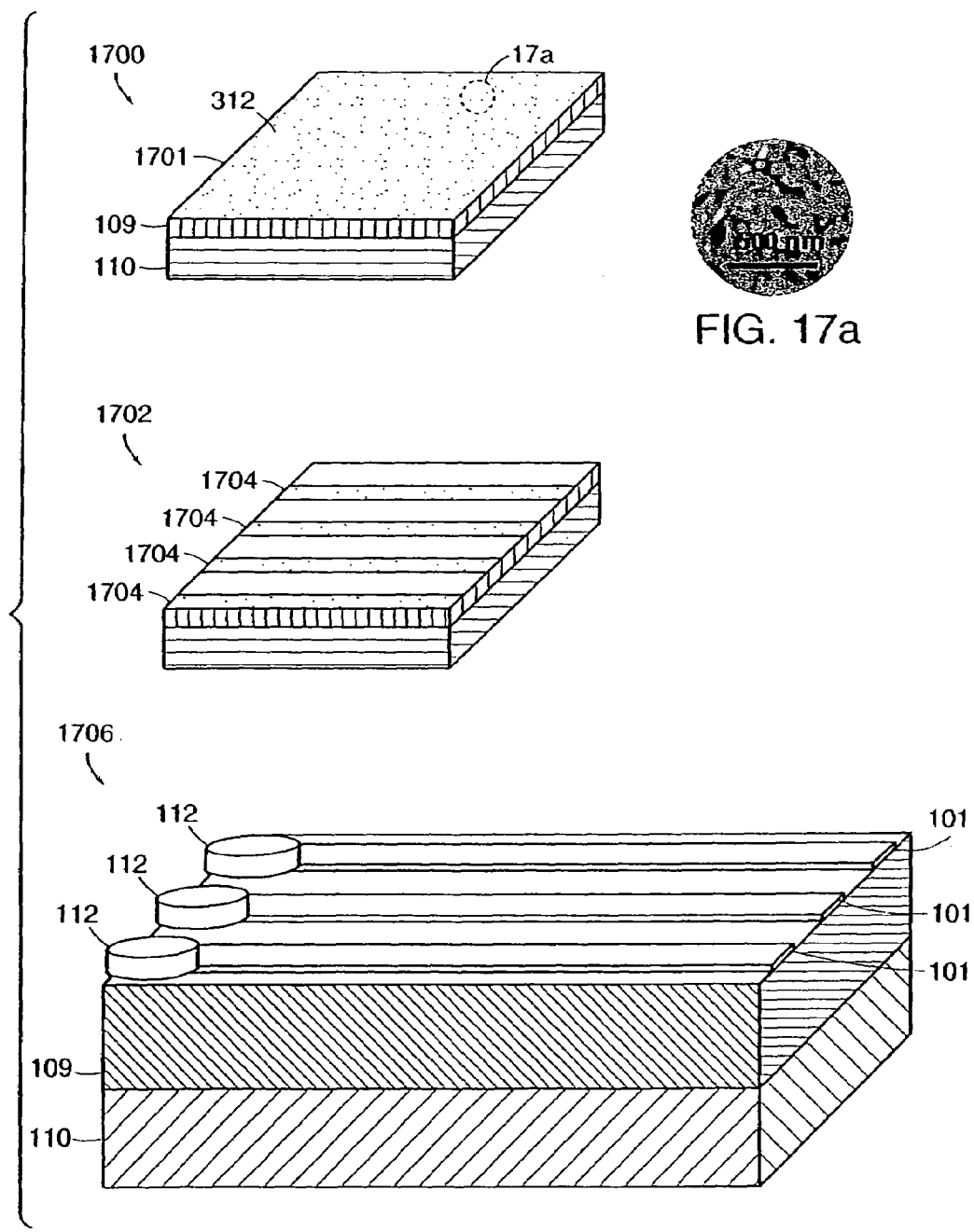
FIG. 17 illustrates acts of making electrically conductive articles according to certain embodiments of the invention.

FIG. 17, for example, illustrates an exemplary use of nanotube ribbons, traces, or electrically conductive articles over a substrate. (By inspection, one can see that FIG. 17 resembles FIG. 3, but in this instance the film 312 is grown over a substrate, instead of growing it over an intermediate structure 310.) In this example, a silicon substrate 110 has an oxide layer 109, similar to that shown in FIG. 3. To facilitate growth or deposition of the film 312, a planar surface (shown as 306 in FIG. 3, but not shown in FIG. 17) may be generated. A film 312 with single- and/or multi-walled nanotubes may then be grown over the combination, e.g., using CVD, or deposited on the combination, e.g., via spin coating. The film 312 is primarily one nanotube thick if single-walled nanotubes are used but can be substantially thicker if multi-walled nanotubes are used, e.g., up to 1000 nm.

If the film is to be grown, a catalyst may be used, as described above. However, the catalyst (shown as 308 in FIG. 3, but not shown in FIG. 17) does not need to be deposited directly on the surface of the substrate; instead or in addition, it may be provided in a gaseous form as part of the CVD process. For example, a gas phase metallic species such as ferrocene could be used. Ferrocene and other gas phase metallic species grow carbon nanotubes as do other species containing iron, molybdenum, tungsten, cobalt and other transition metals. These are all suitable for forming catalysts in the gas phase. The metallic gas-phase catalyst can be optimized or modified along with the proper temperature, pressure, surface preparation and growth time to generate a nanotube matte 312.

If the film 312 is to be deposited, pre-grown nanotubes may be used. For example, under certain embodiments of the invention, nanotubes may be suspended in a solvent in a soluble or insoluble form and spin-coated over the surface to generate the nanotube film 312. In such an arrangement the film may be one or more nanotubes thick, depending on the spin profile and other process parameters. Appropriate solvents include dimethylformamide, n-methyl pyrollidinone, n-methyl formamide, orthodichlorobenzene, paradichlorobenzene, 1,2, dichloroethane, alcohols, water with appropriate surfactants such as sodium dodecylsulfate or TRITON X-100 or others. The nanotube concentration and deposition parameters such as surface functionalization, spin-coating speed, temperature, pH and time can be adjusted for controlled deposition of monolayers or multilayers of nanotubes as required.

The nanotube film 312 could also be deposited by dipping the wafer or substrate in a solution of soluble or suspended nanotubes. The film could also be formed by spraying the nanotubes in the form of an aerosol onto a surface.

When conditions of catalyst composition and density, growth environment, and time are properly controlled, nanotubes can be made to evenly distribute over a given field that is primarily a monolayer of nanotubes.

Upon formation of the nanotube matte 312, a photoresist layer may be spin-coated on the nanotube film 312 and patterned by exposure or the like to define conductive traces. In the example of FIG. 17, the traces are shown as parallel straight traces, but the trace definition may take other forms. The defined traces can have a width of at least 1 nm and as much as 100 microns or more depending upon the type of device which is to be interconnected.

Once so defined, the exposed photoresist may be processed to remove some of the layer but to leave the traces 101. Subsequent metallization may be used to form addressing electrodes or a fanned interconnect structure, e.g., 1706 shown in FIG. 17.

Figure 18:
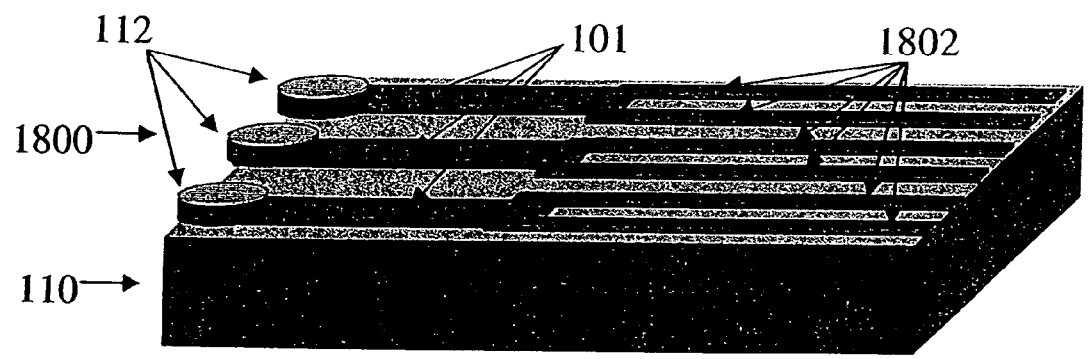
FIG. 18 illustrates how electrically conductive articles according to certain embodiments of the invention may be used to connect electrical components.
Figure 18:
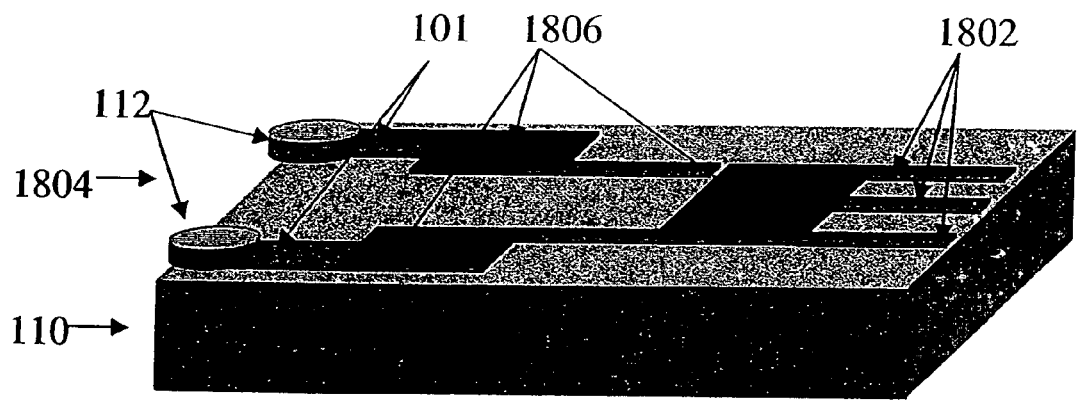
Figure 18:
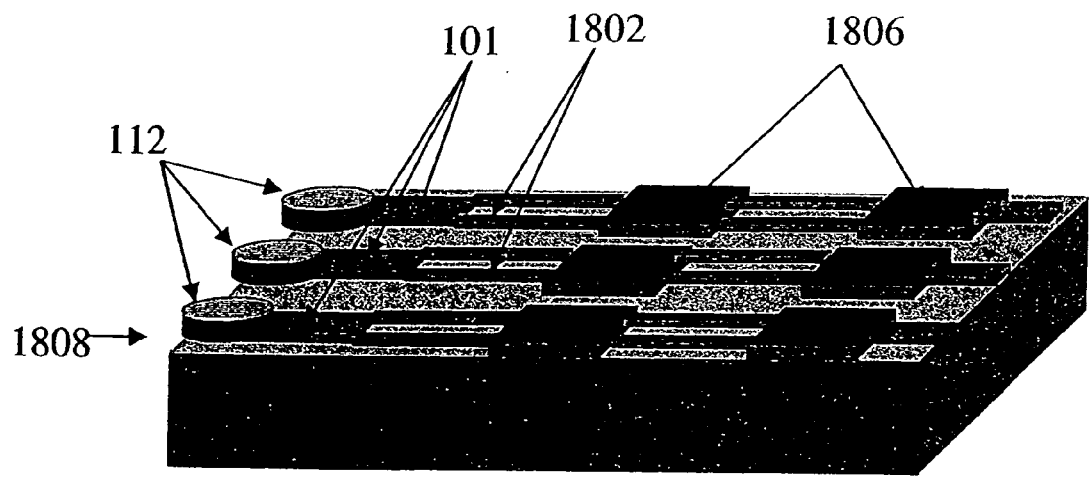

With reference to FIG. 18, nanotube ribbon patterns 1802 may then be connected to other ribbons 101, metallic traces (not shown) or electronic features 1806. For example, with reference to intermediate structure 1800, the nanotube traces 101 may be connected to nanotube traces 1802 having different feature sizes, such as width. The traces 101 may also be connected to elements 112, which may be metal contacts or bonding pads (though not shown to scale in this figure). With reference to intermediate structure 1804, the traces 1010 may connect to memory elements such as in 1804, which may be formed as NTRCM cells or with semiconductor sites. With reference to intermediate structure 1808, the traces may connect electronic processing sites or logic 1806. Though not necessarily drawn to scale, the traces 101 may also connect bond pads, represented by item 112.

While these interconnects may primarily be formed of a monolayer of nanotubes, multilayer ribbons and mattes can also be envisioned using proper growth conditions. This requires control of parameters including but not limited to catalyst composition and concentration, functionalization of the underlying surface, spin coating parameters (length and RPM, for example 40 seconds, 50–5000 rpm), growth time, temperature and gas concentrations.

One aspect of the above technique is that the various growth, deposition, patterning, and etching operations may use conventional techniques, such as lithographic patterning. With current technology, traces may be made to have widths of about 180 nm to as low as 130 nm. However, the physical characteristics of the traces 101 are amenable to even smaller feature sizes if manufacturing capabilities permit.

Conventional interconnect technologies have a tendency to suffer from thermal damage and metal diffusion eroding the performance of the semiconductor devices especially from degradation of the electrical properties. These effects become even more pronounced with size reduction in current generation 0.18 um and 0.13 um structures, e.g. by metal diffusion through ultra-thin gate oxide layers. In contrast, carbon nanotube ribbons 101 are not beset with these problems. They are substantially more robust having the highest known thermal conductivities and are not prone to thermal failure. Furthermore, no metal or dopant diffusion can occur since they are constructed entirely of covalently bound carbon atoms.

Figure 19:
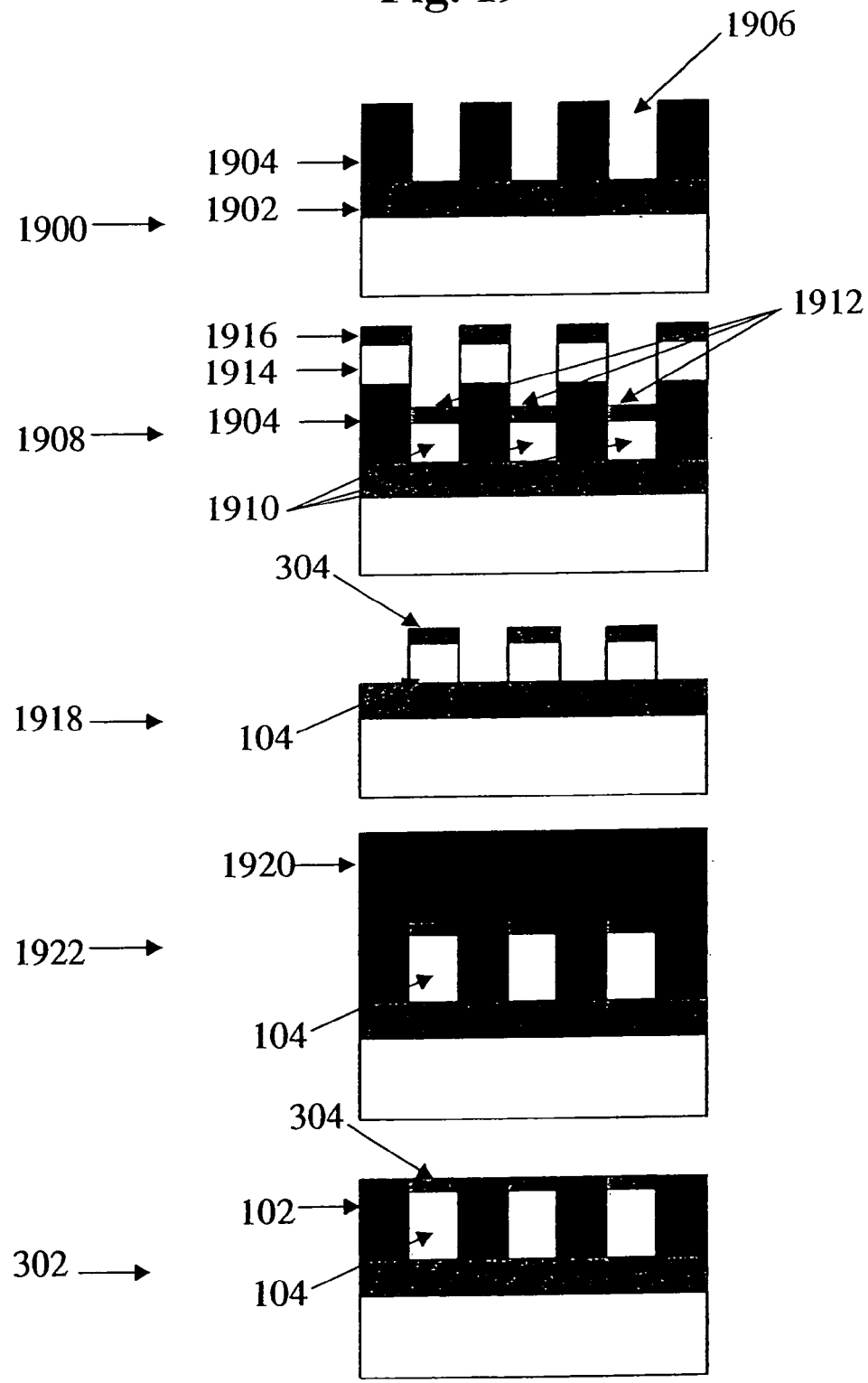
FIG. 19 illustrates a way of creating an intermediate structure according to certain embodiments of the invention.

FIG. 19 shows another approach for forming first intermediate structure 302. A silicon substrate 1900 having a silicon dioxide layer 1902 receives a patterned photoresist layer 1904. For example, a photoresist layer may be spin-coated on layer 1902 and subsequently exposed and lithographically developed yielding cavities 1906 and a mask pattern 1908.

Afterwards, n-doped silicon or metal such as molybdenum, tungsten or tantalum 1910 and a sacrificial layer 1912 such as aluminum oxide may be deposited in the cavities 1906, also forming corresponding features 1914 and 1916.

The photoresist 1912, material 1914 and aluminum oxide (Al2O3) 1916 on top of the photoresist 1912 are then stripped away to form an intermediate structure 1918 with electrodes 104 and sacrificial layer 304. A spin-on-glass (SOG) such as flowable oxide (FOX) is spin-coated over the structure 1918 and annealed using a ramped temperature protocol at 600° C. using standard techniques forming a SiO2 layer 1920 at a height of from 200–2000 nm above the top of the sacrificial layer 1912.

Reactive ion etching (RIE) or the like may then be used to etch the SiO2 layer 1920 to form a structure 302 with supports 102.

The choice of electrode material is limited by the method by which the nanotubes are placed upon the substrate surface. The three above methods include spin-coated catalyst-based growth, gas-phase catalyst-assisted CVD and spin-coating or direct deposition of nanotubes. In the case of the catalyst-based growth as has been described above the catalyst is distributed on the surface either by spin-coating, or dipping the substrate in the catalyst material followed by standard washing protocols. In each of these cases the nanotubes are then grown via a CVD process at 800° C. using a combination of hydrogen and carbon-containing precursor gas as has been described above. Thus, electrode materials which are sufficiently robust to survive these temperatures would be preferred including molybdenum, tungsten, tantalum, germanium, copper and alloys thereof. The electrode material can be constructed of a single or stacked structure of materials including silicon, tungsten, molybdenum, tantalum, copper and others. The stacked electrode structure may assist with or be sufficient in creating a Schottky barrier sufficient for rectification of each memory bit.

In the event that the nanotubes are grown using a gas-phase catalyst such as ferrocene, it is possible to envision substantially lower temperatures being required for growth allowing the use of electrode materials that melt at a substantially lower temperature less than 800° C. and as low as 400° C. Some gas-phase catalysts of interest may include cobalt, tungsten, molybdenum or rhenium metallocenes containing five of six-membered rings. These compounds can with the proper knowledge of inorganic chemistry be synthesized and brought by the use of a bubbler into the gas-phase to act as nucleation sites on substrates for nanotube growth. Of course these materials would be substantively compatible with the typical CMOS processes known in the literature and used by standard industrial fabrication facilities.

In the event that nanotubes are deposited on a surface at room temperature by spin-coating of a solution or suspension of nanotubes then the choice of electrode materials is expanded substantially. In this case there is no high temperature step and any metal typically compatible with standard CMOS metallization conditions would be acceptable especially, aluminum, and alloys thereof.

The sacrificial layer 304 can be constructed of Al2O3, metal oxides, salts, metals and other materials. The intermediate structure 302 can be formed using a variety of materials to form the supports 102 including SOG, SiO2 and others. In the event that a low temperature spin-coating of nanotube protocol is chosen the materials suitable to be sacrificial layers expands substantially. This could include materials such as PMMA or other polymers, metals such tungsten, chromium, aluminum, bismuth and other transition and main group metals. Also other semiconductors such as germanium and insulators such as salts, oxides and other chalcogenides.

The choice of materials for the support layer greatly depends upon the method chosen for nanotube growth and other factors. In the even that a low-temperature process is chosen for placing nanotubes on the surface, one can envision utilizing such materials as Al2O3, silicon monoxide, semiconductors, insulators and polymers such as polyimide.

The materials selection process is confined to those materials that are compatible with the fabrication process described above. It is understood by those sufficiently skilled in the art that upon selection of a particular electrode material, the sacrificial layer and support materials naturally become limited based upon typical processing steps available in semiconductor fabrication. Likewise if a particular sacrificial layer is chosen the choices of electrode and sacrificial layer materials is suitably limited. Furthermore, upon selection of a particular support material it follows that the electrode and sacrificial layer materials choice is likewise limited.

Figure 20:
FIG. 20 illustrates a non-woven nanotube fabric, or matted nanotube layer, used to make certain embodiments of the invention.

FIG. 20 shows an Atomic Force Microscopic (AFM) image of an exemplary nanotube fabric 312. In this figure, each nanotube is about 1.5 nm in diameter. (The image is fuzzy due to the inherent limitations in the microscopy, not due to the actual texture of a given nanotube.) This image is at the lateral resolution limit of AFM.

Though most of the disclosure above is written as if the fabric were made of nanotubes of the same type, e.g., all single walled, the fabrics may be composed of all multi-walled structures or of a combination of single- and multi-walled structures.

OTHER EMBODIMENTS

In order to facilitate the growth of interconnects or electrode materials it may become useful to first form a pattern using standard lithographic methods to define regions where the nanotubes are intended to grow in a horizontal fashion over the surface. Such an approach has been used to pattern SiO2 structures to grow thick multiwalled vertical nanotubes. In a similar approach patterned SiO2 can be used for the purpose of growing horizontal nonotube films with a thickness of 1–1000 nm to create structures of the form described above such as 101. Other materials which provide a support for nanotube growth and nucleation such as insulators and metal oxides may be useful when used in concert with properly chosen gas-phase metallocenes or other vaporizeable metallic precursors to yield patterned nanotube ribbons. This underlying patterned layer could also act as a sacrificial layer which upon removal would form a suspended nanotubes. This method of growth represents a form of "positive" growth whereby the nanotubes use the prepatterned surface as a nucleation site.

In a further embodiment one can envision using a "negative" growth method whereby the lithographically patterned substrate contains a metallic or other material which does not support nanotube growth. When a proper gas-phase precursor such as a metallocene or similar compound is supplied the nanotubes would substantively grow only in the regions without the patterned material. The removal of an underlying material could provide suspended nanotubes 101 or interconnect structures upon the removal of the patterned metallic species.

In yet another embodiment, instead of using wet-chemical removal of sacrificial layer to suspend nanotubes at specific height over electrodes, a controlled etch of the electrode (i.e. 15 nm etch of 0.18 um wide electrode) can be used; e.g. metal (e.g. copper) and semiconductor (e.g. silicon) electrodes can be etched at etch rates of a few nanometer per second.

In another embodiment pinning of nanotubes onto the supports using an overlayed thin coating to prevent slipping of tubes during operation. This would open "windows" just over the memory cell itself.

The electrical properties of the layers and electrically conductive articles can be tuned by controlling the cross section of the nanotube ribbons. For example, the ribbon thickness may be increased at a given width and nanotube density. The higher the cross section, the greater the number of conduction channels leading to enhanced electrical properties.

The method of preparing of the nanotube ribbons allows continuous conductivity even over rough surface topologies. In contrast, typical evaporation of metallic electrodes would suffer from structural and thus, electrical defects.

Besides carbon nanotubes other materials with electronic and mechanical properties suitable for electromechanical switching could be envisioned. These materials would have properties similar to carbon nanotubes but with different and likely reduced tensile strength. The tensile strain and adhesion energies of the material must fall within a range to allow bistability of the junction and electromechanical switching properties to exist within acceptable tolerances.

For the purpose of integrating CMOS logic for addressing two approaches can be envisioned. In the first embodiment the nanotube array will be integrated before metallization but after ion implantation and planarization of the CMOS logic devices. A second method involves growth of the nanotube arrays before fabrication of the CMOS devices involving ion implementation and high temperature annealing steps. Upon completion of these steps the final metallization of both the nanotube ribbons and the CMOS devices will proceed using standard and widely used protocols.

Electrodes consisting of n-doped silicon on top of some metal or semiconductor line can also be envisioned. This will still provide rectifying junctions in the ON state so that no multiple current pathways exist.

In addition to rectifying junctions, there are other widely accepted and used methods to prevent the occurrence of electrical crosstalk (i.e. multiple current pathways) in crossbar arrays. Tunnel barriers on top of the static, lithographically fabricated electrodes prevent the formation of ohmic ON states. No leakage currents at zero bias voltage will occur but a small bias voltage has to be applied for the charge carriers to overcome this barrier and tunnel between the crossing lines.

Methods to increase the adhesion energies through the use of ionic, covalent or other forces can be envisioned to alter the interactions with the electrode surfaces. These methods can be used to extend the range of bistability with these junctions.

Nanotubes can be functionalized with planar conjugated hydrocarbons such as pyrenes which may then aid in enhancing the internal adhesion between nanotubes within the ribbons.

Certain of the above aspects, such as the hybrid circuits and the nanotube technology for addressing, are applicable to individual nanotubes (e.g., using directed growth techniques, etc.) or to nanotube ribbons.

It will be further appreciated that the scope of the present invention is not limited to the above-described embodiments but rather is defined by the appended claims, and that these claims will encompass modifications of and improvements to what has been described.

What is claimed is:

1. An assembly including a substrate and a conductive trace disposed on the substrate, the trace having at least two sides that are substantially parallel to each other, wherein the trace includes a plurality of unaligned nanotubes for providing a plurality of conductive pathways along the trace.

2. The assembly of claim 1 wherein the nanotubes include single walled carbon nanotubes.

3. The assembly of claim 1 wherein the nanotubes include multi-walled nanotubes.

4. The assembly of claim 1 wherein the nanotubes have different lengths.

5. The assembly of claim 1 wherein the nanotubes include nanotubes having a length shorter than the length of the article.

6. An assembly including a substrate and a conductive trace disposed on the substrate, the trace having a width and a length, the length being substantially larger than the width, wherein the trace includes an electrical network of a plurality of unaligned nanotubes in contact with other nanotubes to provide a plurality of conductive pathways along the trace.

7. The assembly of claim 6 wherein the nanotubes include single walled carbon nanotubes.

8. The assembly of claim 6 wherein the nanotubes include multi-walled carbon nanotubes.

9. The assembly of claim 6 wherein the nanotubes have different lengths.

10. The assembly of claim 6 wherein the nanotubes include nanotubes having a length shorter than the length of the ribbon.

11. An assembly including a substrate and a conductive trace of predefined shape, the conductive trace being over the substrate, the conductive trace including a plurality of unaligned nanotubes for providing a plurality of conductive paths along the extent of the trace.

12. An assembly including a substrate, at least one metal electrode, and a conductive trace of predefined shape, the conductive trace being over the substrate, the conductive trace including a plurality of unaligned nanotubes for providing a plurality of conductive paths along the extent of the trace, and the metal electrode being over at least a portion of the conductive trace, the metal electrode being formed by a metallization step.

13. A wafer substrate structure having a non-woven fabric of unaligned nanotubes substantially parallel to and covering a major surface of the wafer substrate, the major surface of the substrate comprising a plurality of patterned conductors, and wherein the nanotubes of the fabric are arranged in accordance with inherent self-assembly traits of the nanotubes.

14. A wafer substrate structure having a non-woven fabric of unaligned nanotubes covering a major surface of the wafer substrate, the major surface of the substrate comprising a plurality of patterned conductors, and wherein the fabric comprises substantially a monolayer of nanotubes.

15. A wafer substrate structure having a non-woven fabric of unaligned nanotubes substantially parallel to and covering a major surface of the wafer substrate and wherein the fabric comprises a multilayer fabric having a controlled density of nanotubes.

16. A plurality of conductive traces on a substrate, each conductive trace extending substantially parallel to the substrate and comprising a non-woven fabric of carbon nanotubes, the plurality of conductive traces extending substantially parallel to each other and having a spaced relation between adjacent conductive traces.

17. The plurality of conductive traces of claim 16, wherein the substrate comprises a plurality of patterned conductors under the plurality of conductive traces.

18. The plurality of conductive traces of claim 17, further comprising a plurality of patterned conductors over the plurality of conductive traces.

* * * * *